United States Patent
Kudo et al.

(10) Patent No.: US 7,322,081 B2
(45) Date of Patent: Jan. 29, 2008

(54) METHOD OF MANUFACTURING A SURFACE ACOUSTIC WAVE DEVICE

(75) Inventors: Takuo Kudo, Fukushima-ken (JP);
Takeshi Ikeda, Fukushima-ken (JP);
Takashi Sato, Fukushima-ken (JP);
Kyosuke Ozaki, Fukushima-ken (JP);
Yutaka Matsuo, Fukushima-ken (JP);
Toshihiro Meguro, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/388,943

(22) Filed: Mar. 24, 2006

(65) Prior Publication Data
US 2006/0220764 A1    Oct. 5, 2006

(30) Foreign Application Priority Data
Apr. 5, 2005 (JP) ............................. 2005-108834

(51) Int. Cl.
*H01L 41/22* (2006.01)
*H01L 41/00* (2006.01)

(52) U.S. Cl. .................. 29/25.35; 29/846; 29/847; 29/593; 29/594; 310/313 R

(58) Field of Classification Search ............. 29/25.35, 29/846, 848, 594, 857, 593, 893; 216/49, 216/13, 55; 310/313 R, 313 B, 313 A, 365; 333/193
See application file for complete search history.

(56) References Cited

U.S. PATENT DOCUMENTS 4,603,275 A * 7/1986 Mochizuki et al. ..... 310/313 B
5,390,401 A * 2/1995 Shikata et al. ............. 29/25.35
5,998,907 A * 12/1999 Taguchi et al. ......... 310/313 R
6,367,133 B2 * 4/2002 Ikada et al. ................ 29/25.35
6,557,225 B2 * 5/2003 Takata et al. .............. 29/25.35
2001/0029650 A1   10/2001 Takata et al.

FOREIGN PATENT DOCUMENTS

| EP | 0452105 A2 | 10/1991 |
| EP | 10163789 | 6/1998 |
| EP | 1387488 A2 | 2/2004 |
| EP | 1521362 A2 | 4/2005 |
| JP | 2002-374137 | 12/2002 |

OTHER PUBLICATIONS

European Search Report dated Aug. 22, 2006 from corresponding European Application.

* cited by examiner

*Primary Examiner*—A. Dexter Tugbang
*Assistant Examiner*—Tai Van Nguyen
(74) *Attorney, Agent, or Firm*—Beyer Weaver LLP

(57) ABSTRACT

According to the method of manufacturing a surface acoustic wave device of the invention, since a conductor layer is formed on electrode sections in a state where the entire regions of inter digital transducer and reflectors are covered with an insulating film, the inter digital transducer and the reflectors are protected by the insulating film during formation of the conductor layer. As a result, it is possible to obtain a highly efficient surface acoustic wave device with no sticking of foreign matters to the inter digital transducer and the reflectors.

2 Claims, 27 Drawing Sheets

METHOD OF MANUFACTURING A SURFACE ACOUSTIC WAVE DEVICE

BACKGROUND OF THE INVENTION

1. Field of the Invention

The present invention relates to a method of manufacturing a surface acoustic wave device which is applied to antenna duplexers, etc. suitable for use in cell phones, etc.

2. Description of the Related Art

A conventional surface acoustic wave device and a manufacturing method thereof will be described with reference to the accompanying drawings wherein FIG. 43 is a plan view showing a comb-like electrode and a reflector of a conventional surface acoustic wave device, FIG. 44 is a sectional view of essential parts of the conventional surface acoustic wave device, FIG. 45 is a sectional view of essential parts showing a first step of a method of manufacturing the conventional surface acoustic wave device, FIG. 46 is a sectional view of essential parts showing a second step of the method of manufacturing the conventional surface acoustic wave device, FIG. 47 is a sectional view of essential parts showing a third step of the method of manufacturing the conventional surface acoustic wave device, and FIG. 48 is a plan view showing the third step of the method of manufacturing the conventional surface acoustic wave device.

FIG. 49 is a sectional view of essential parts showing a fourth step of the method of manufacturing the conventional surface acoustic wave device, FIG. 50 is a sectional view of essential parts showing a fifth step of the method of manufacturing the conventional surface acoustic wave device, FIG. 51 is a sectional view of essential parts showing a sixth step of the method of manufacturing the conventional surface acoustic wave device, FIG. 52 is a plan view showing the sixth step of the method of manufacturing the conventional surface acoustic wave device, FIG. 53 is a sectional view of essential parts showing a seventh step of the method of manufacturing the conventional surface acoustic wave device, FIG. 54 is a plan view showing the seventh step of the method of manufacturing the conventional surface acoustic wave device, FIG. 55 is a sectional view of essential parts showing an eighth step of the method of manufacturing the conventional surface acoustic wave device, FIG. 56 is a sectional view of essential parts showing a ninth step of the method of manufacturing the conventional surface acoustic wave device; and FIG. 57 is a sectional view of essential parts showing the ninth step of the method of manufacturing the conventional surface acoustic wave device.

Next, the construction of a conventional surface acoustic wave device will be described with reference to FIGS. 43 and 44. Referring to these drawings, on one surface of a piezoelectric substrate 51 is formed a conventional surface acoustic wave device including a paired set of two inter digital transducer 52a and 52b, electrode sections 53a and 53b connected to the inter digital transducer 52a and 52b, respectively, a conductor layer 55 formed on the electrode sections 53a and 53b, with an intermediate layer 54 made of a metal different from the electrode sections 53a and 53b between the conductor layer and the electrode sections, bumps 56 formed on portions of the conductor layer 55, ladder-like reflectors 57a and 57b provided adjacent to both sides of the inter digital transducer 52a and 52b, and an insulating film 58 provided so as to cover an entire region of the inter digital transducer 52a and 52b and the reflectors 57a and 57b Next, a method of manufacturing the conventional surface acoustic wave device having such a construction will be described with reference to FIGS. 45 to 57. First, a negative resist film 60 is formed on the one entire surface of the piezoelectric substrate 51 and then exposed using a mask. Thereafter, the exposed resist film 60, as shown in FIG. 45, is left by removing the resist film 60, which has not been exposed, by a solution.

That is, the resist film 60 is disposed in clearances (spots where a conductor is not formed) between the inter digital transducer 52a and 52b and the reflectors 57a and 57b.

Next, as shown in FIG. 46, a conductor is formed on the one entire surface of the piezoelectric substrate 51 by vapor-depositing a conductive material. Thereafter, as shown in FIGS. 47 and 48, when the resist film 60 is removed, inter digital transducer 52a and 52b, electrode sections 53a and 53b, reflectors 57a and 57b, and a protective conductor 61 which electrically connects the electrodes, the electrode sections, and the reflectors with one another, are formed.

Next, a negative resist film 60 is formed on one entire surface of FIGS. 47 and 48, and exposed with the electrode sections 53a and 53b being masked. Thereafter, as shown in FIG. 49, the exposed resist film 60 is left on the electrode sections 53a and 53b by removing the resist film 60 on the electrode sections 53a and 53b, which has not been exposed, by a solution.

Next, as shown in FIG. 50, a conductive material is vapor-deposited on one entire surface of the piezoelectric substrate 51, thereby forming a conductor composed of an intermediate layer 54 and a conductor layer 55. Thereafter, as shown in FIGS. 51 and 52, when the resist film 60 is removed, a conductor layer 55 is formed on the electrode sections 53a and 53b, with an intermediate layer 54 therebetween.

Next, as shown in FIGS. 53 and 54, bumps 56 are formed on portions of the conductor layer 55. Thereafter, as shown in FIG. 55, an insulating film 58 is formed on sputtering. After that, as shown in FIG. 56, the portion of the insulating film 58 excluding the regions of the inter digital transducer 52a and 52b and reflectors 57a and 57b are removed.

Next, as shown in FIG. 57, the inter digital transducer 52a and 52b having the electrode sections 53a and 53b, and the reflectors 57a and 57b are independently formed by removing the protective conductor 61 by etching. Thereafter, as shown in FIG. 44, when an adjustment of thinning the insulating film 58 is made so that the surface acoustic wave device has a desired frequency characteristic, manufacture of the conventional surface acoustic wave device is completed.

In the method of manufacturing the conventional surface acoustic wave device, the inter digital transducer 52a and 52b, the reflectors 57a and 57b, and the protective conductor 61 which electrically connects the electrodes and the reflectors with one another are formed on one surface of the piezoelectric substrate 51. Thereafter, the conductive layer 55 is formed on the electrode sections 53a and 53b with the intermediate layer 54 therebetween, and the bumps 56 are formed on the conductor layer 55. After the step, the regions of the inter digital transducer 52a and 52b and reflectors 57a and 57b are covered with the insulating film 58. Therefore, there is a problem in that, in the processes before the insulating film 58 is formed, foreign matters may stick to the regions of the inter digital transducer 52a and 52b and reflectors 57a and 57b, thereby worsening the performance.

Further, since the formation regions of the intermediate layer 54 and conductor layer 55 are formed by the resist film 60 when the intermediate layer 54 and the conductor 55 are formed, there is a problem in that the number of manufacturing processing increases, thus resulting in a high cost.

SUMMARY OF THE INVENTION

It is therefore an object of the invention to provide a method of manufacturing a surface acoustic wave device which is inexpensive and highly efficient.

As a first means for solving the problems, there is provided a method of manufacturing a surface acoustic wave device which prevents sticking of foreign matters. The surface acoustic wave device has a piezoelectric substrate; at least one paired set of inter digital transducer provided on one surface of the piezoelectric substrate; electrode sections connected to the inter digital transducer; a conductor layer provided on the electrode sections; reflectors provided adjacent to both sides of the inter digital transducer; and an insulating film formed so as to cover entire regions of the inter digital transducer and reflectors. The method includes the steps of: forming the inter digital transducer, the reflectors, and a protective conductor which electrically connects the inter digital transducer with the reflectors, in an entire region other than the regions where the inter digital transducer and the reflectors are formed, on the one surface of the piezoelectric substrate, then forming an insulating film so as to cover at least the entire regions of the inter digital transducer and the reflectors, and then forming the conductor layer on the electrode sections in a state where the entire regions of the inter digital transducer and the reflectors are covered with the insulating film; and removing the protective conductor.

Further, as a second solving means, there is provided the method of manufacturing a surface acoustic wave device in which the insulating film other than the regions of the inter digital transducer and the reflectors is removed and the protective conductor is removed after the insulating film is formed on the one entire surface of the piezoelectric substrate, then the insulating film is removed at locations corresponding to the electrode sections, and thereafter the conductor layer is formed on the electrode sections.

Further, as a third solving means, there is provided the method of manufacturing a surface acoustic wave device including a plurality of sets of the inter digital transducer, the reflectors provided so as to correspond to the plurality of sets of inter digital transducer, respectively, and a connection pattern which joins the electrode sections connected to the inter digital transducer together. The method includes the steps of: forming the inter digital transducer, the reflectors, and the protective conductor which electrically connects the inter digital transducer with the reflectors, in an entire region other than the regions where the inter digital transducer and the reflectors are formed, on the one surface of the piezoelectric substrate, then forming the insulating film so as to cover at least the entire region of each set of the inter digital transducer and the reflectors, and then forming the conductor layer on the electrode sections and the connection pattern in a state where the entire regions of the inter digital transducer and the reflectors are covered with the insulating film; and removing the protective conductor.

Further, as a fourth solving means, there is provided the method of manufacturing a surface acoustic wave device in which the insulating film other than the regions of the inter digital transducer and the reflectors is removed and the protective conductor is removed after the insulating film is formed on the one entire surface of the piezoelectric substrate, then the insulating film is removed at locations corresponding to the electrode sections and the connection pattern, and thereafter the conductor layer is formed on the electrode sections and the connection pattern.

According to the method of manufacturing a surface acoustic wave device of the invention, since the conductor layer is formed on the electrode sections in a state where the entire regions of the inter digital transducer and the reflectors are covered with the insulating film, the inter digital transducer and the reflectors are protected by the insulating film during formation of the conductor layer. As a result, it is possible to obtain a highly efficient surface acoustic wave device without sticking of foreign matters to the inter digital transducer and the reflectors.

Further, since the insulating film is formed on the one entire surface of the piezoelectric substrate, and then removed at locations corresponding to the electrode sections, thereafter, the conductor layer is formed on the electrode sections, the formation region of the conductor layer is formed by the insulating film. Accordingly, a resist film for forming the conductor layer becomes unnecessary. As a result, the number of manufacturing processes is reduced, whereby a low-cost surface acoustic wave device can be obtained.

Further, since the conductor layer is formed on the electrode sections in a state where the entire regions of each set of the inter digital transducer and the reflectors are covered with the insulating film, the inter digital transducer and the reflectors are protected by the insulating film during formation of the conductor layer. As a result, it is possible to obtain a highly efficient surface acoustic wave device without sticking of foreign matters to the inter digital transducer and the reflectors.

Further, since the insulating film is formed on the one entire surface of the piezoelectric substrate and then removed at locations corresponding to the electrode sections and the connection pattern, thereafter, the conductor layer is formed on the electrode sections and the connection pattern, the formation region of the conductor layer is formed by the insulating film. Accordingly, a resist film for forming the conductor layer becomes unnecessary. As a result, the number of manufacturing processes is reduced, whereby a low-cost surface acoustic wave device can be obtained.

DESCRIPTION OF THE PREFERRED EMBODIMENT

Figure 1:
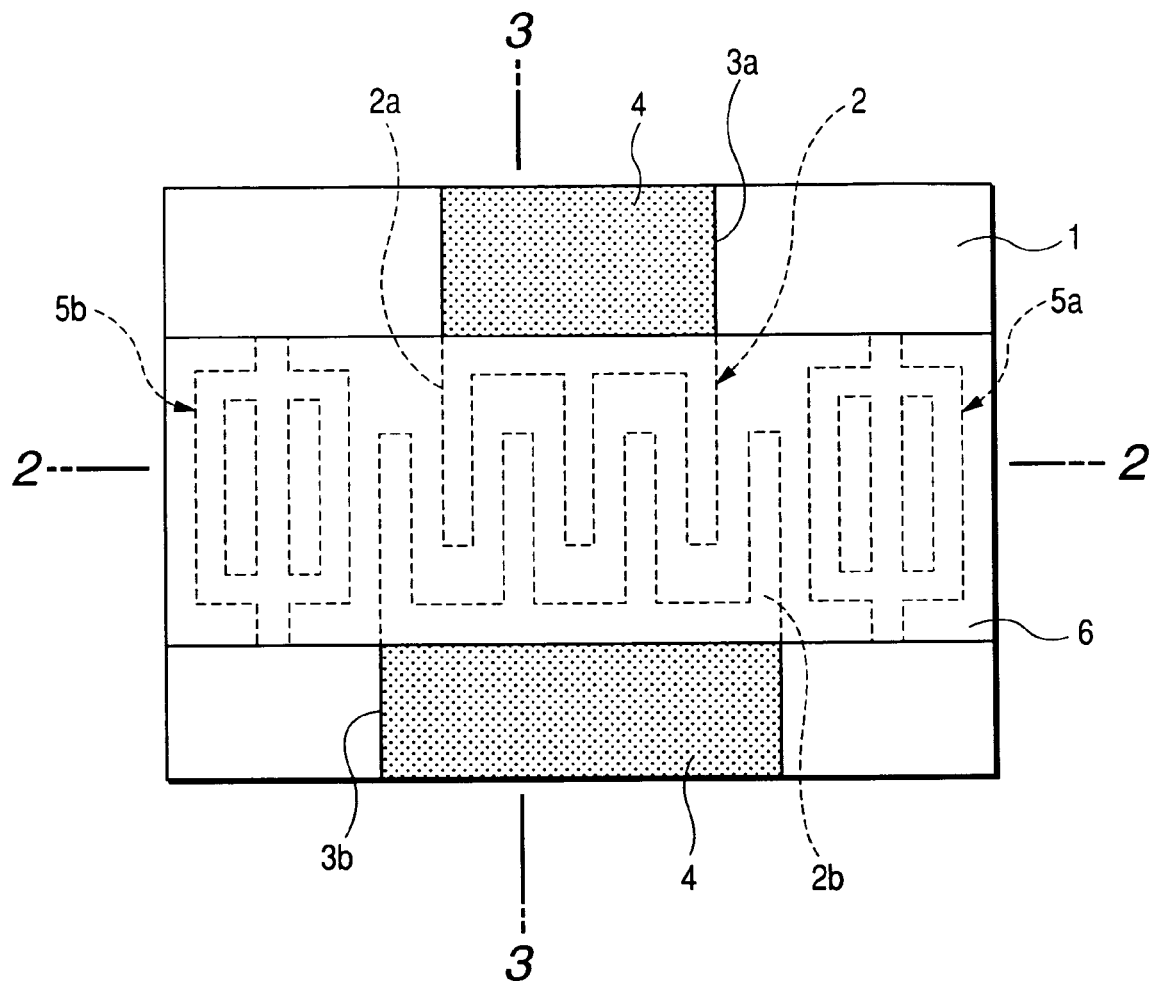
FIG. 1 is a plan view of a surface acoustic wave device according to a first embodiment of the invention.
Figure 2:
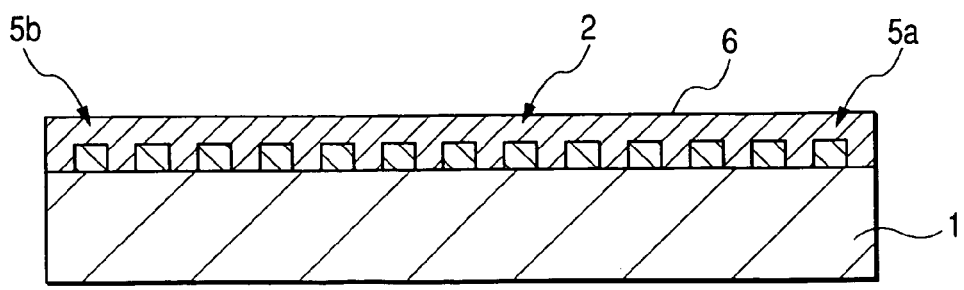
FIG. 2 is a sectional view taken along the line 2-2 in FIG. 1.
Figure 3:
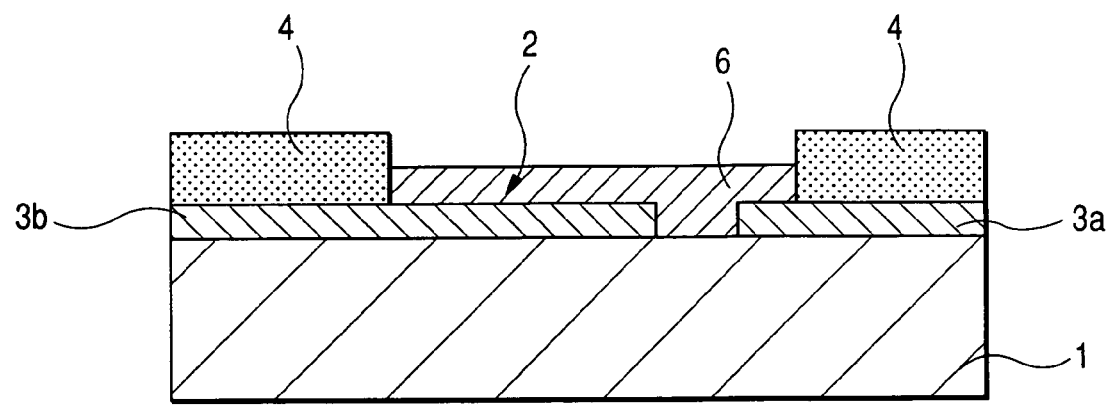
FIG. 3 is a sectional view taken along the line 3-3 in FIG. 1.
Figure 4:
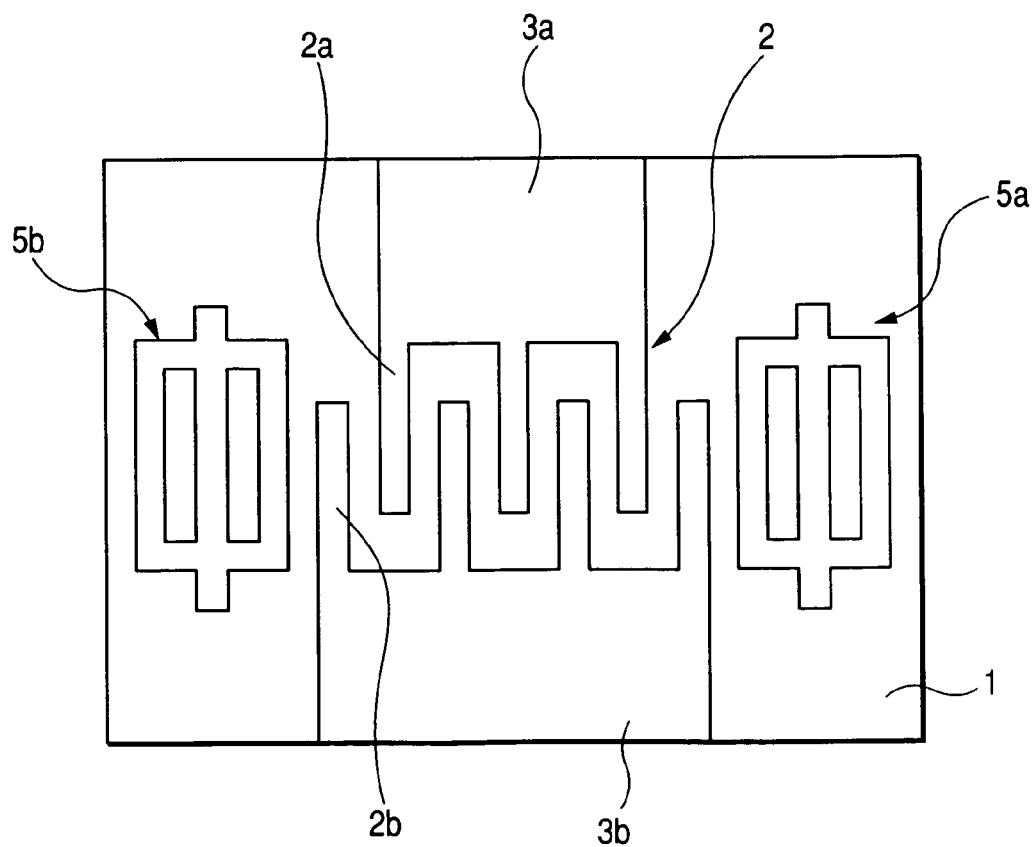
FIG. 4 is a plan view showing a comb-like electrode and a reflector of the surface acoustic wave device according to the first embodiment of the invention.
Figure 5:
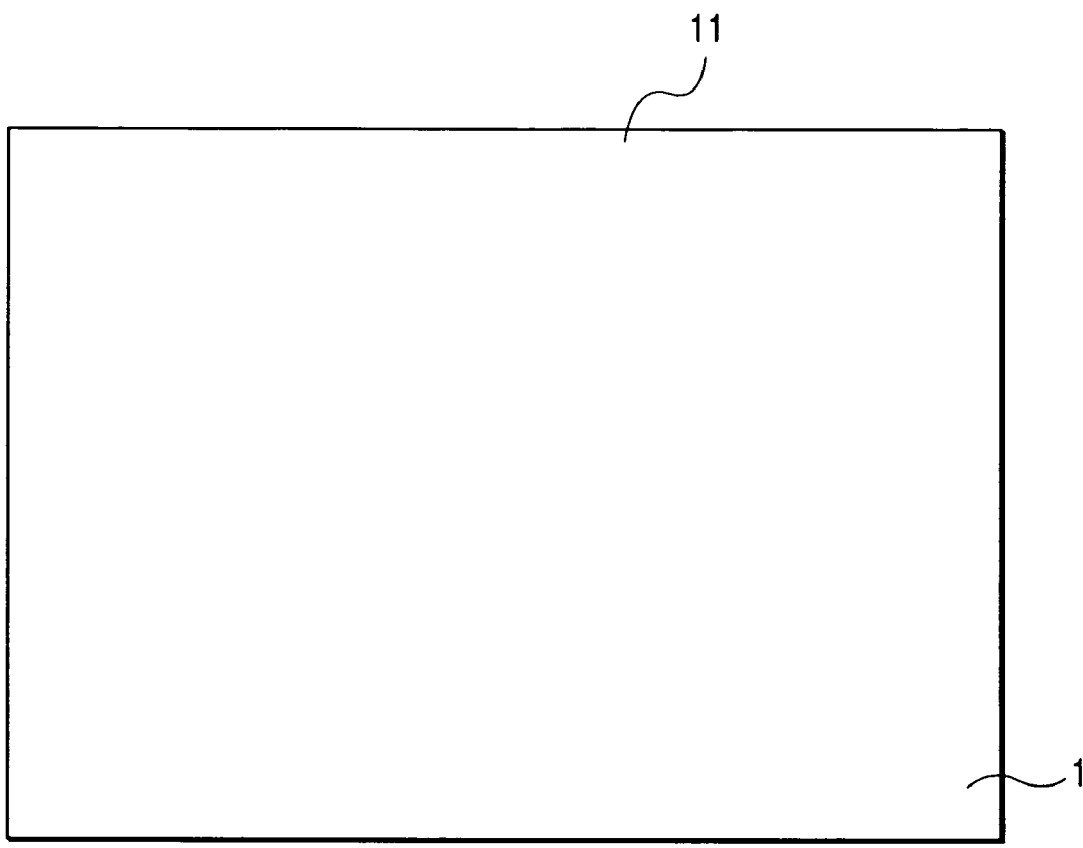
FIG. 5 is a plan view showing a first process of a method of manufacturing a surface acoustic wave device according to the first embodiment of the invention.
Figure 6:
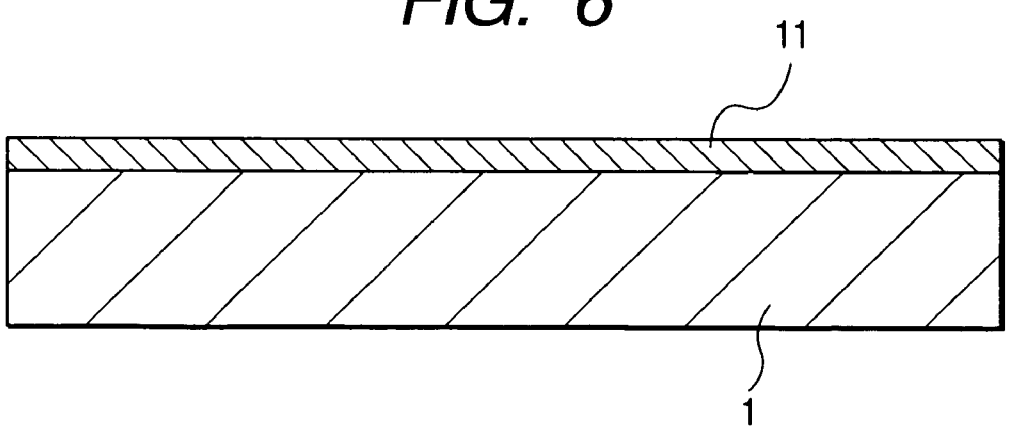
FIG. 6 is a plan view showing the first process of the method of manufacturing a surface acoustic wave device according to the first embodiment of the invention.
Figure 7:
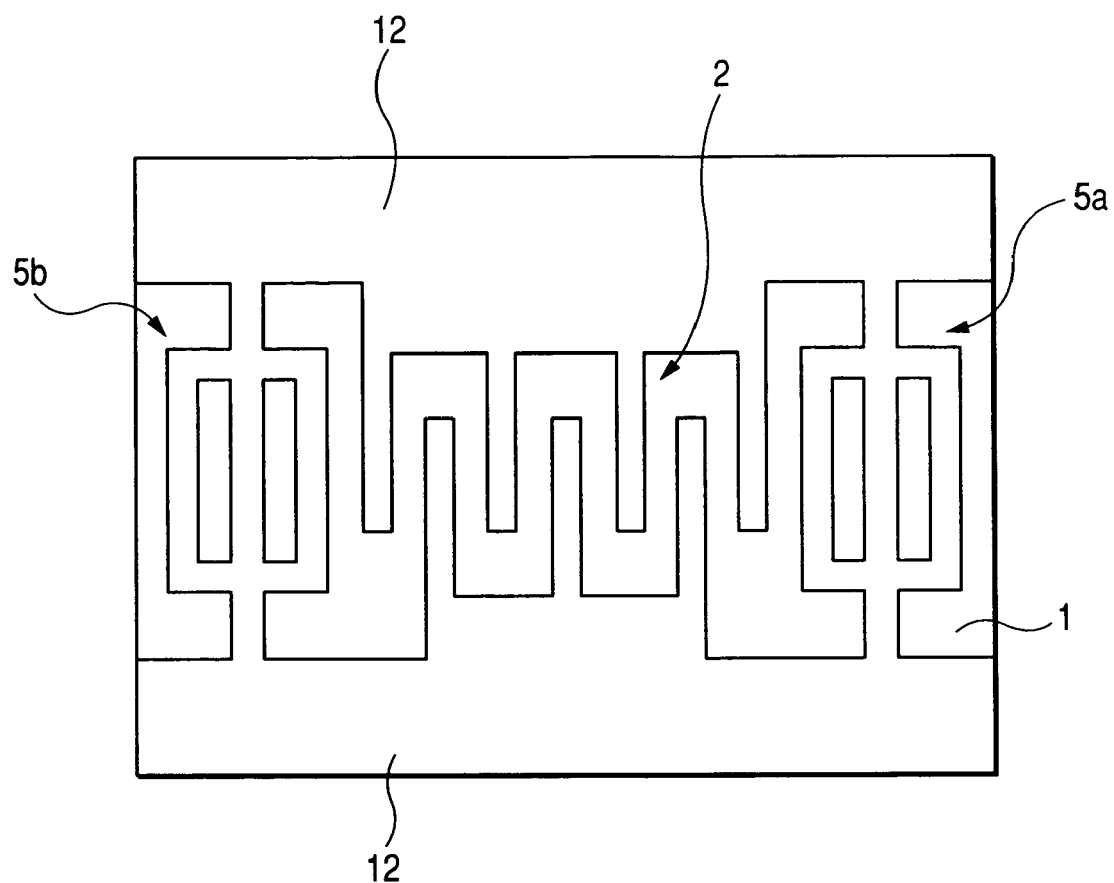
FIG. 7 is a plan view showing a second process of the method of manufacturing a surface acoustic wave device according to the first embodiment of the invention.
Figure 8:
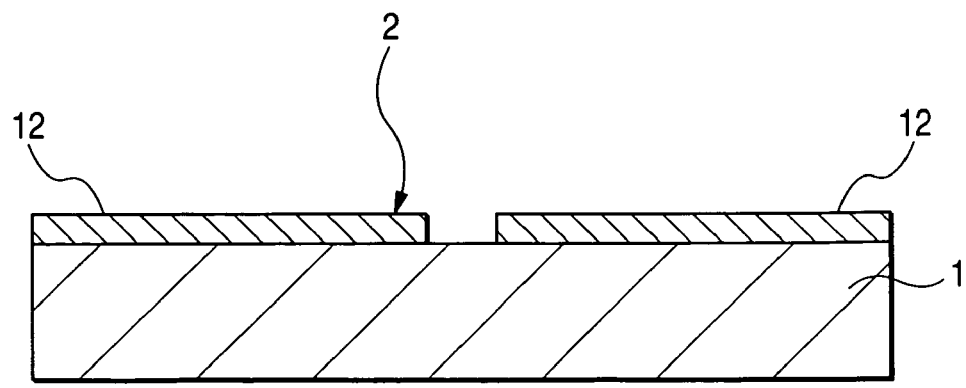
FIG. 8 is a plan view showing the second process of the method of manufacturing a surface acoustic wave device according to the first embodiment of the invention.

A surface acoustic wave device and a manufacturing method thereof will be described with reference to the accompanying drawings wherein FIG. 1 is a plan view of a surface acoustic wave device according to a first embodiment of the invention, FIG. 2 is a sectional view taken along the line 2-2 in FIG. 1, FIG. 3 is a sectional view taken along the line 3-3 in FIG. 1, FIG. 4 is a plan view showing a comb-like electrode and a reflector of the surface acoustic wave device according to the first embodiment of the invention, FIG. 5 is a plan view showing a first process of a method of manufacturing a surface acoustic wave device according to the first embodiment of the invention, FIG. 6 is a plan view showing the first process of the method of manufacturing a surface acoustic wave device according to the first embodiment of the invention, FIG. 7 is a plan view showing a second process of the method of manufacturing a surface acoustic wave device according to the first embodiment of the invention, and FIG. 8 is a plan view showing the second process of the method of manufacturing a surface acoustic wave device according to the first embodiment of the invention.

Figure 9:
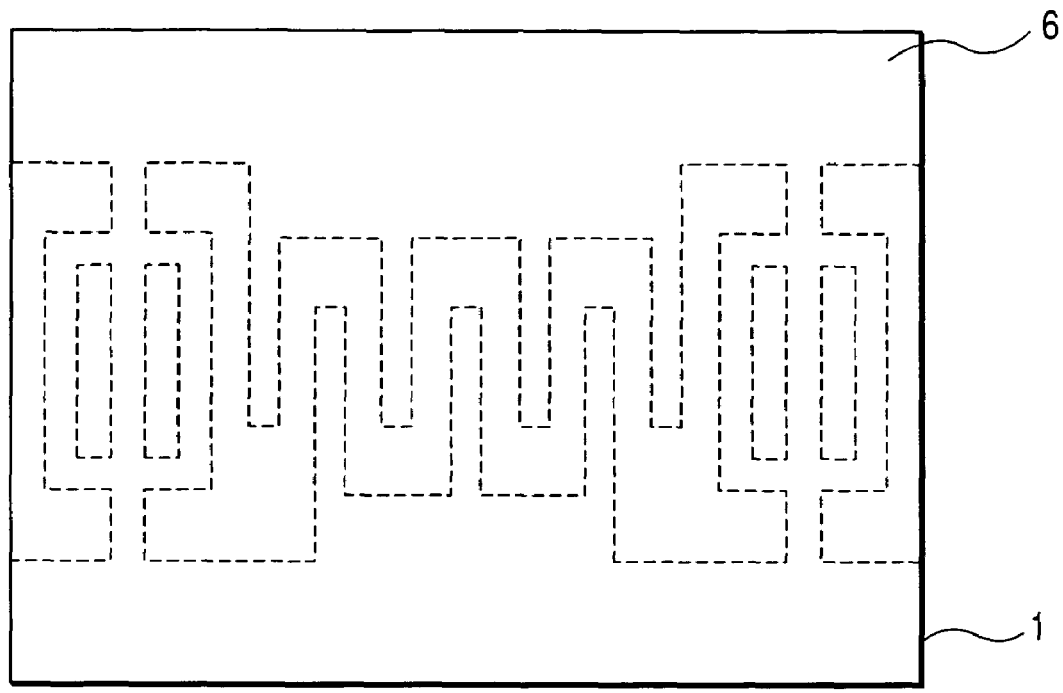
FIG. 9 is a plan view showing a third process of the method of manufacturing a surface acoustic wave device according to the first embodiment of the invention.
Figure 10:
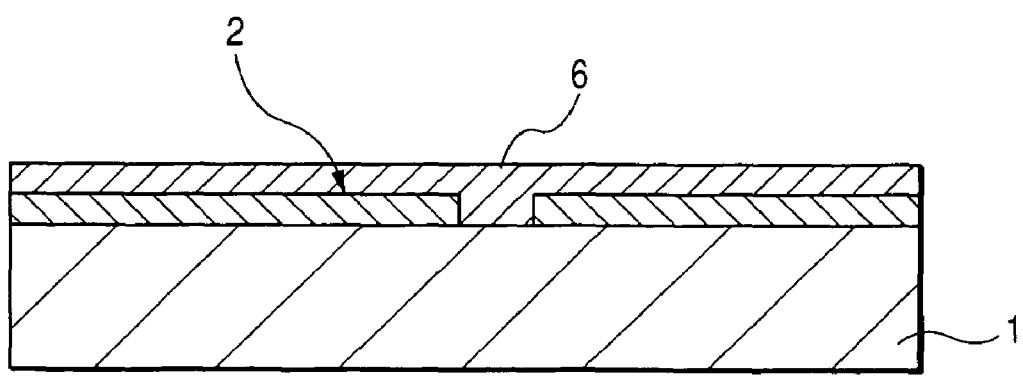
FIG. 10 is a plan view showing the third process of the method of manufacturing a surface acoustic wave device according to the first embodiment of the invention.
Figure 11:
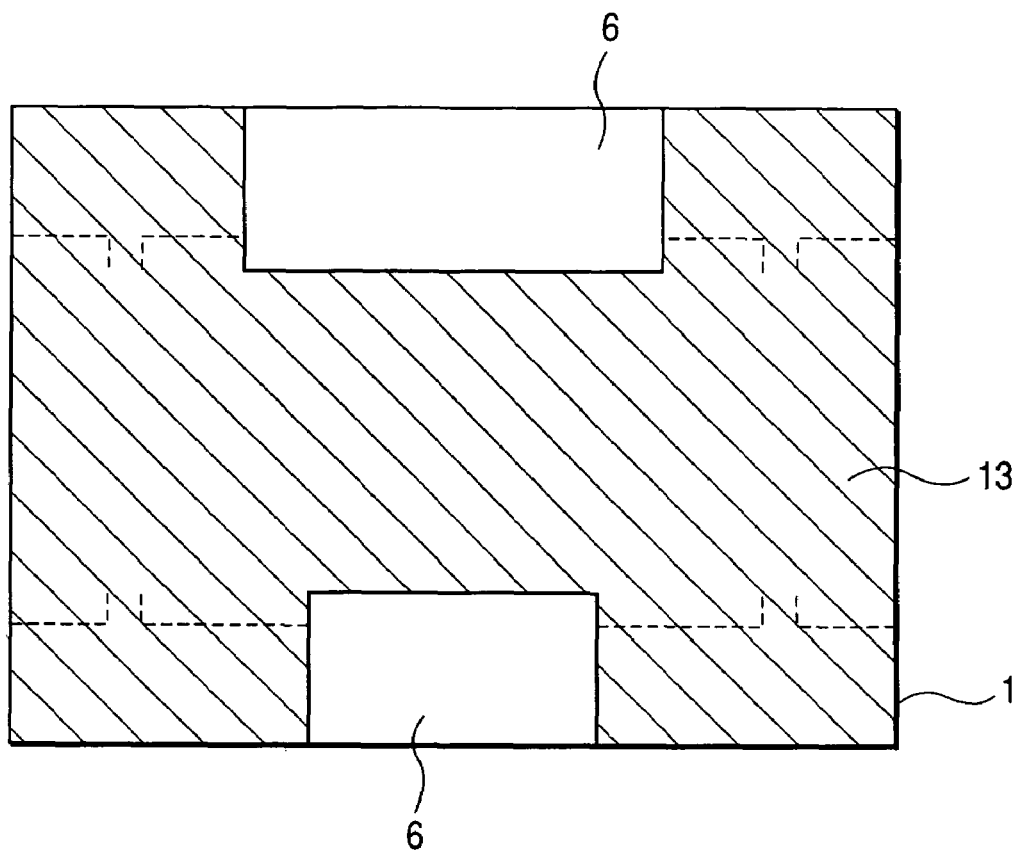
FIG. 11 is a plan view showing a fourth process of the method of manufacturing a surface acoustic wave device according to the first embodiment of the invention.
Figure 12:
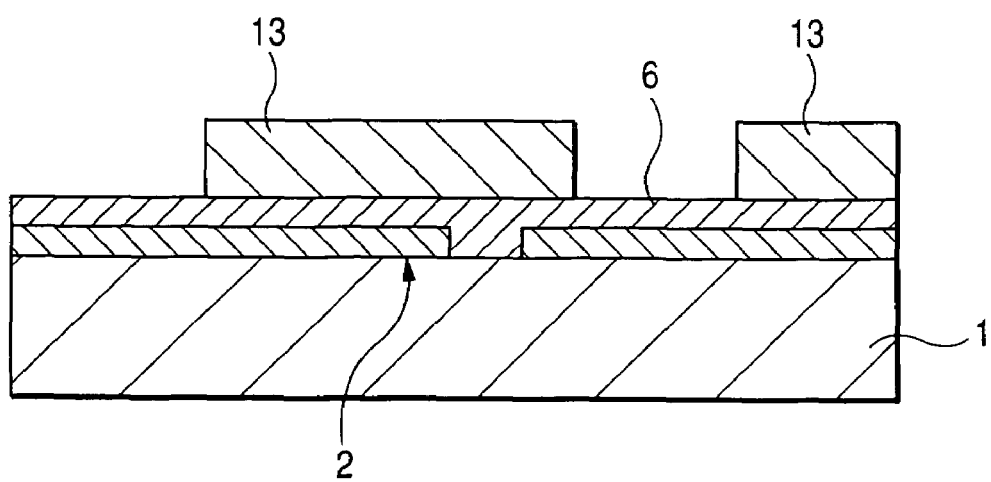
FIG. 12 is a plan view showing the fourth process of the method of manufacturing a surface acoustic wave device according to the first embodiment of the invention.
Figure 13:
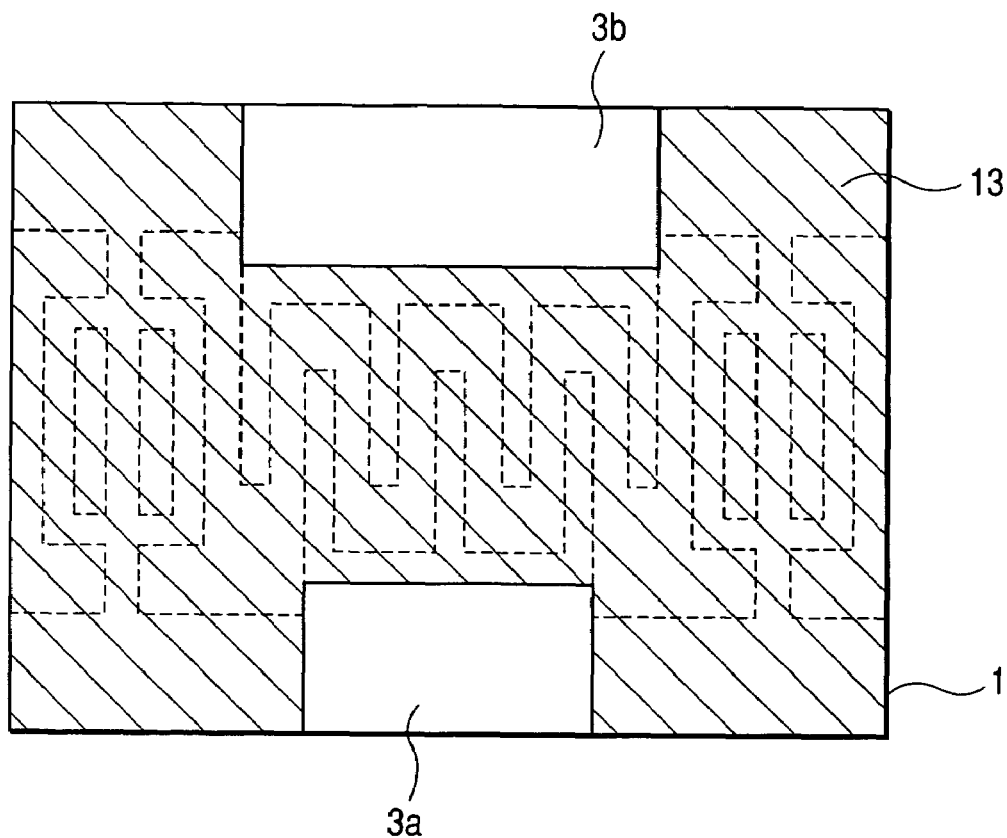
FIG. 13 is a plan view showing a fifth process of the method of manufacturing a surface acoustic wave device according to the first embodiment of the invention.
Figure 14:
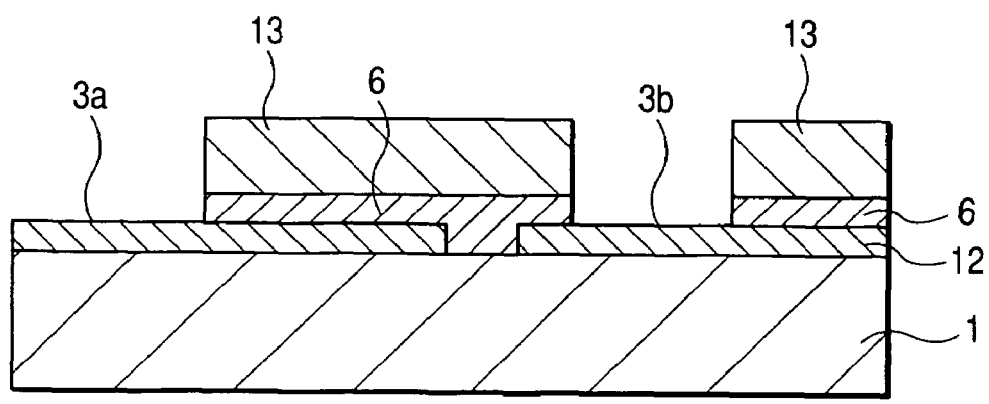
FIG. 14 is a plan view showing the fifth process of the method of manufacturing a surface acoustic wave device according to the first embodiment of the invention.

Further, FIG. 9 is a plan view showing a third process of the method of manufacturing a surface acoustic wave device according to the first embodiment of the invention, FIG. 10 is a plan view showing the third process of the method of manufacturing a surface acoustic wave device according to the first embodiment of the invention, FIG. 11 is a plan view showing a fourth process of the method of manufacturing a surface acoustic wave device according to the first embodiment of the invention, FIG. 12 is a plan view showing the fourth process of the method of manufacturing a surface acoustic wave device according to the first embodiment of the invention, FIG. 13 is a plan view showing a fifth process of the method of manufacturing a surface acoustic wave device according to the first embodiment of the invention, and FIG. 14 is a plan view showing the fifth process of the method of manufacturing a surface acoustic wave device according to the first embodiment of the invention.

Figure 15:
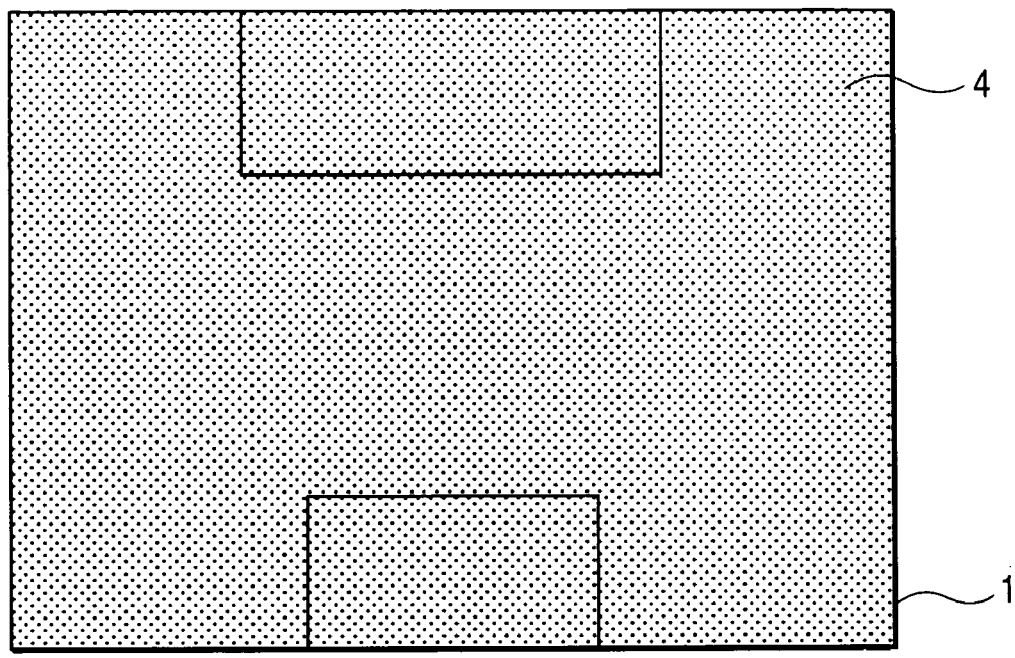
FIG. 15 is a plan view showing a sixth process of the method of manufacturing a surface acoustic wave device according to the first embodiment of the invention.
Figure 16:
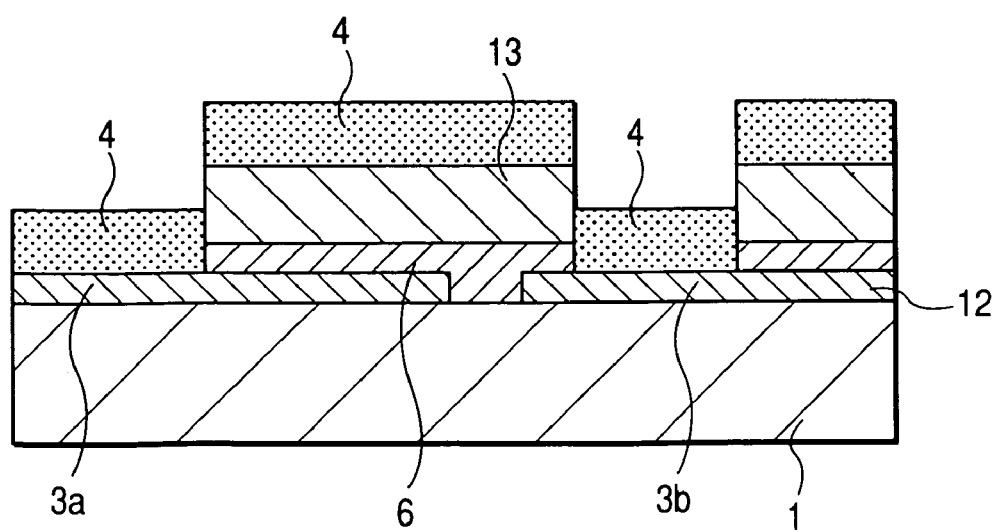
FIG. 16 is a plan view showing the sixth process of the method of manufacturing a surface acoustic wave device according to the first embodiment of the invention.
Figure 17:
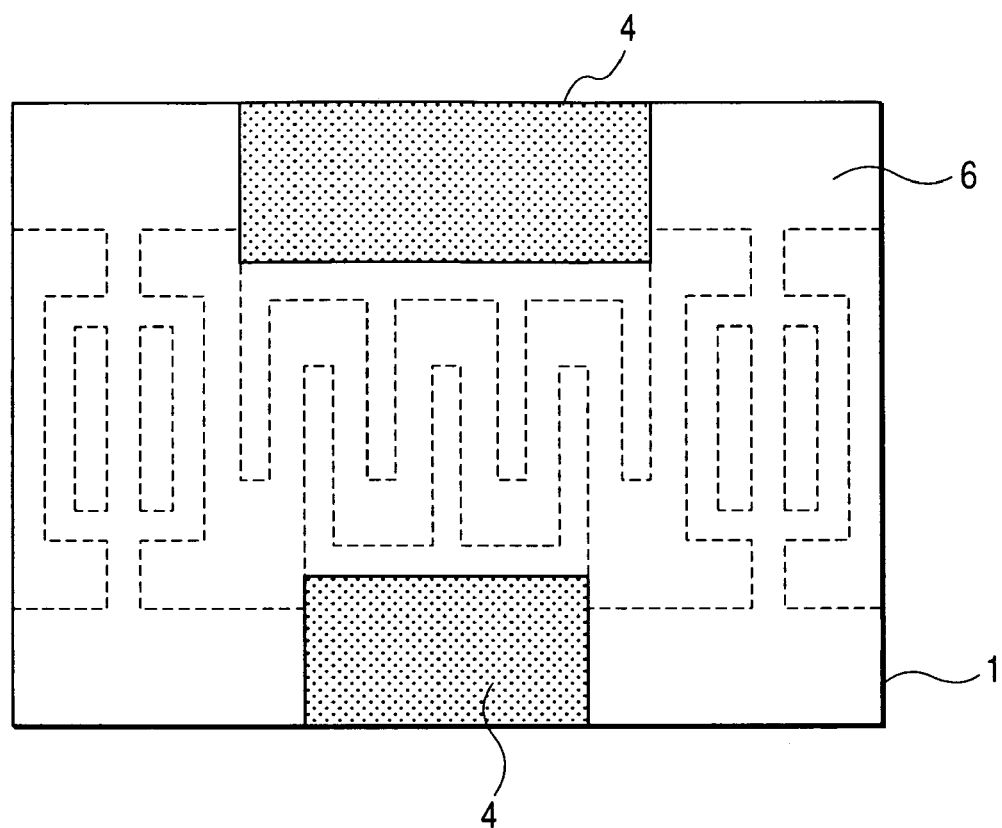
FIG. 17 is a plan view showing a seventh process of the method of manufacturing a surface acoustic wave device according to the first embodiment of the invention.
Figure 18:
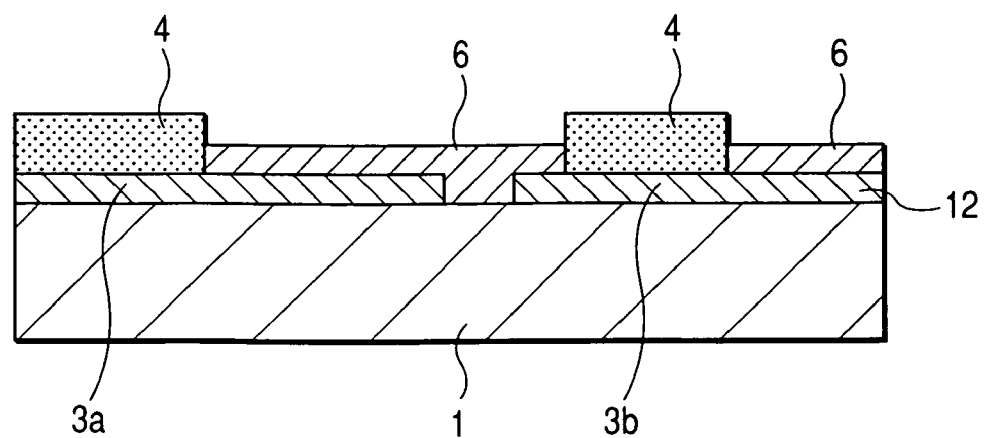
FIG. 18 is a plan view showing the seventh process of the method of manufacturing a surface acoustic wave device according to the first embodiment of the invention.
Figure 19:
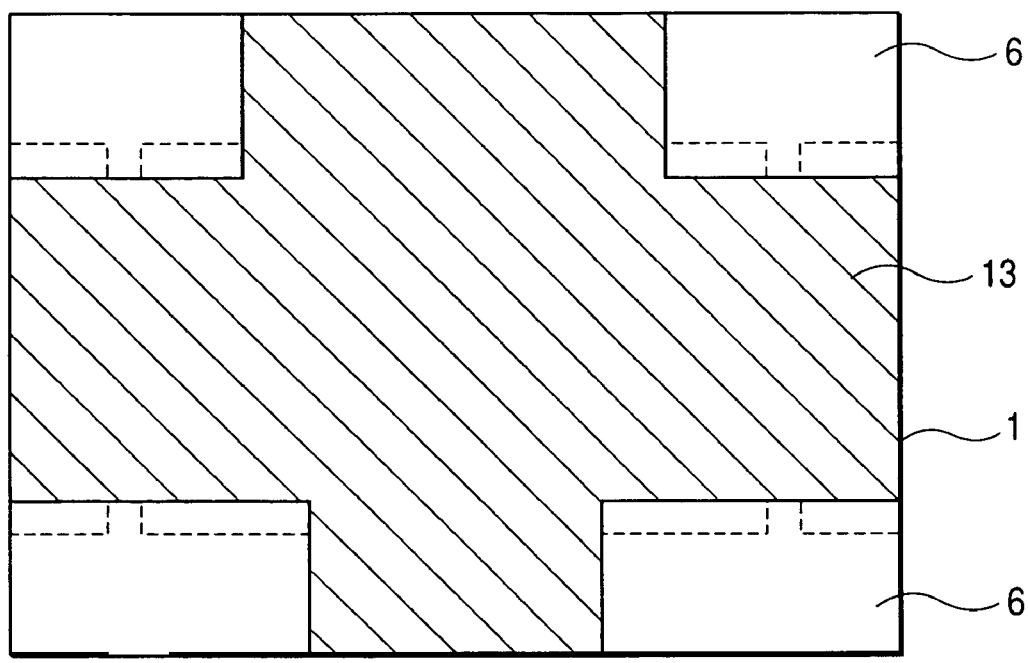
FIG. 19 is a plan view showing an eighth process of the method of manufacturing a surface acoustic wave device according to the first embodiment of the invention.
Figure 20:
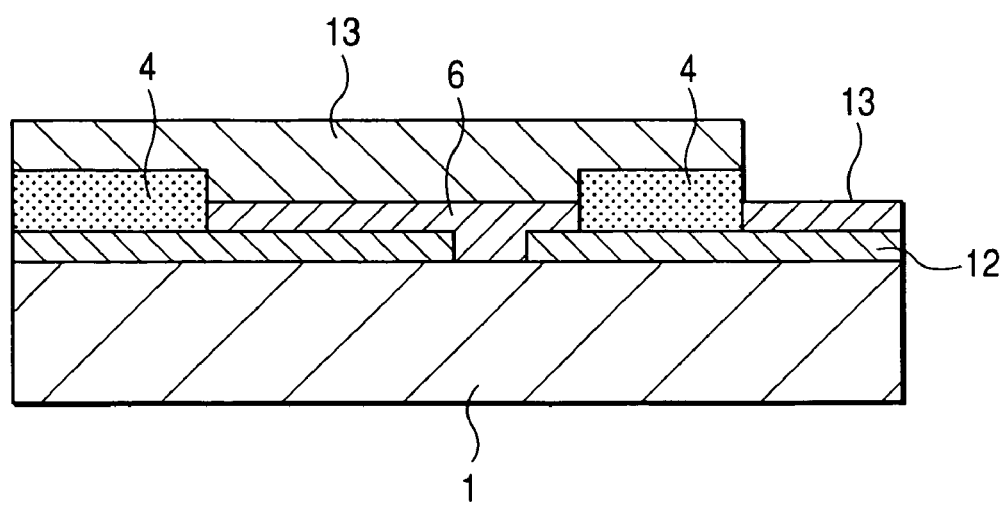
FIG. 20 is a plan view showing the eighth process of the method of manufacturing a surface acoustic wave device according to the first embodiment of the invention.
Figure 21:
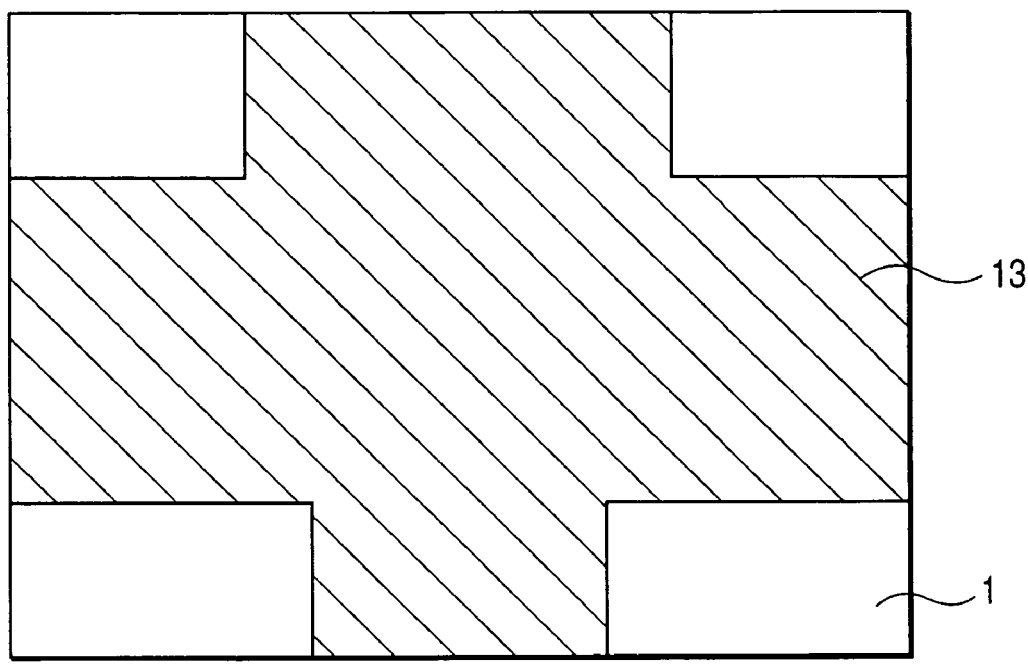
FIG. 21 is a plan view showing a ninth process of the method of manufacturing a surface acoustic wave device according to the first embodiment of the invention.
Figure 22:
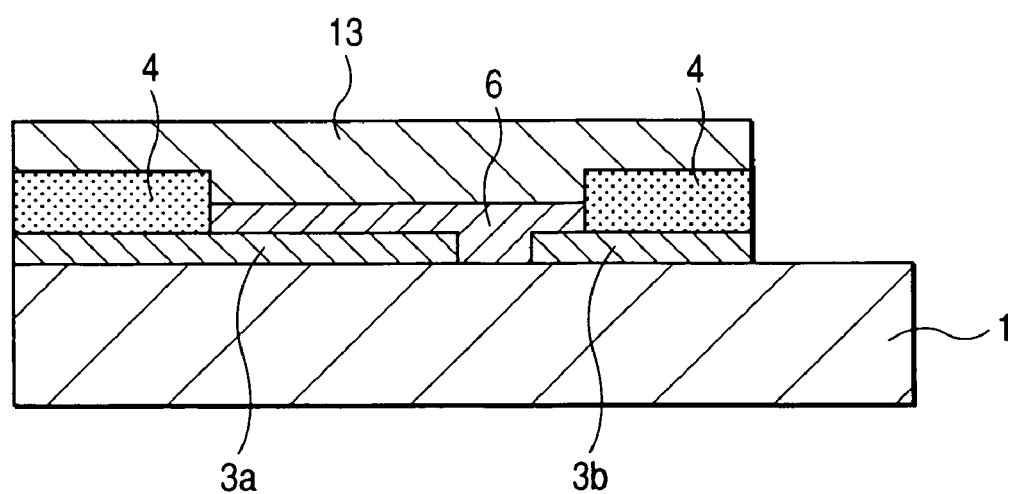
FIG. 22 is a plan view showing the ninth process of the method of manufacturing a surface acoustic wave device according to the first embodiment of the invention.

Further, FIG. 15 is a plan view showing a sixth process of the method of manufacturing a surface acoustic wave device according to the first embodiment of the invention, FIG. 16 is a plan view showing the sixth process of the method of manufacturing a surface acoustic wave device according to the first embodiment of the invention, FIG. 17 is a plan view showing a seventh process of the method of manufacturing a surface acoustic wave device according to the first embodiment of the invention, FIG. 18 is a plan view showing the seventh process of the method of manufacturing a surface acoustic wave device according to the first embodiment of the invention, FIG. 19 is a plan view showing an eighth process of the method of manufacturing a surface acoustic wave device according to the first embodiment of the invention, FIG. 20 is a plan view showing the eighth process of the method of manufacturing a surface acoustic wave device according to the first embodiment of the invention, FIG. 21 is a plan view showing a ninth process of the method of manufacturing a surface acoustic wave device according to the first embodiment of the invention, and FIG. 22 is a plan view showing the ninth process of the method of manufacturing a surface acoustic wave device according to the first embodiment of the invention.

Figure 23:
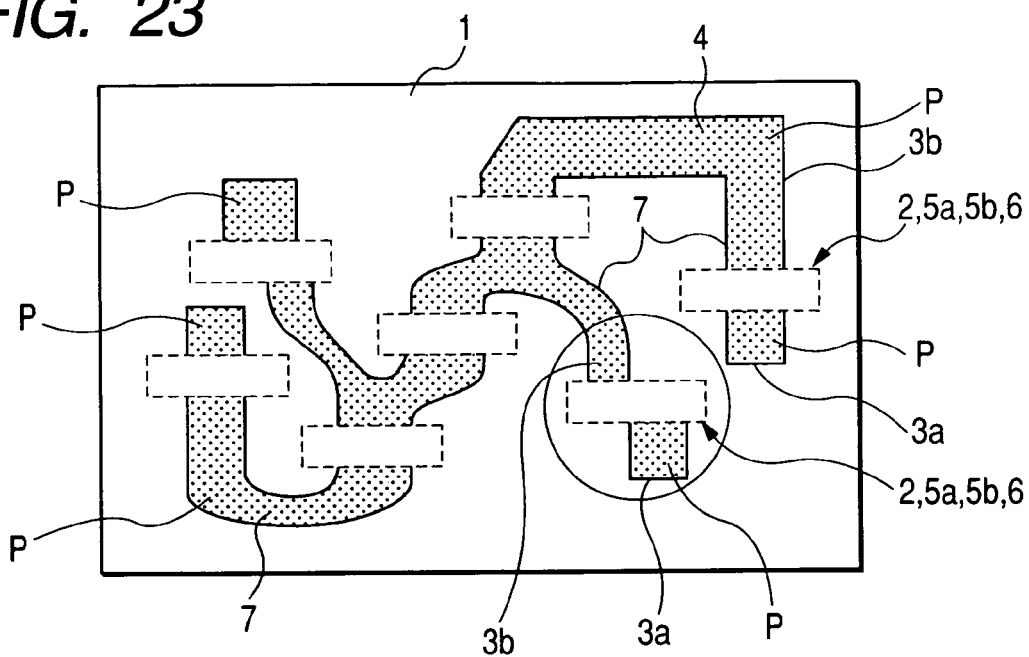
FIG. 23 is a plan view of a surface acoustic wave device according to a second embodiment of the invention.
Figure 24:
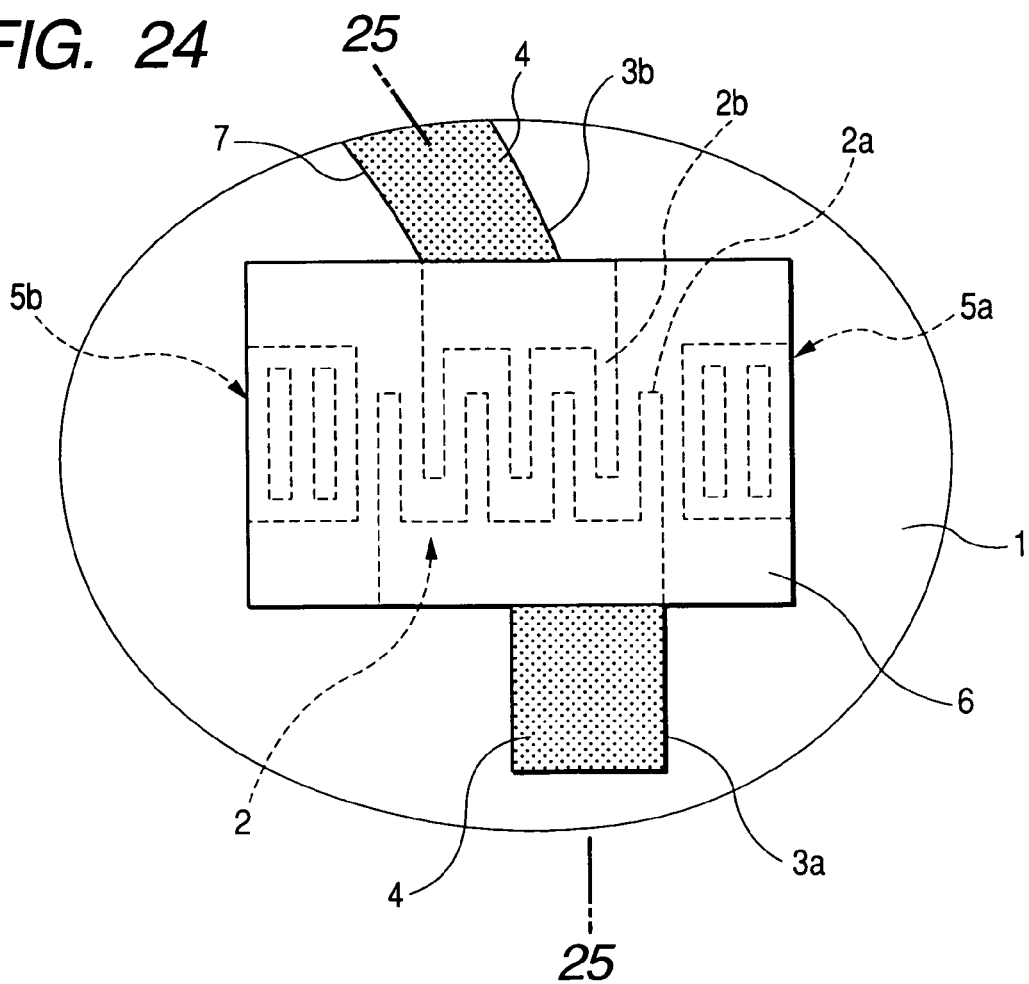
FIG. 24 is an enlarged plan view of essential parts of the surface acoustic wave device according to a second embodiment of the invention.
Figure 25:
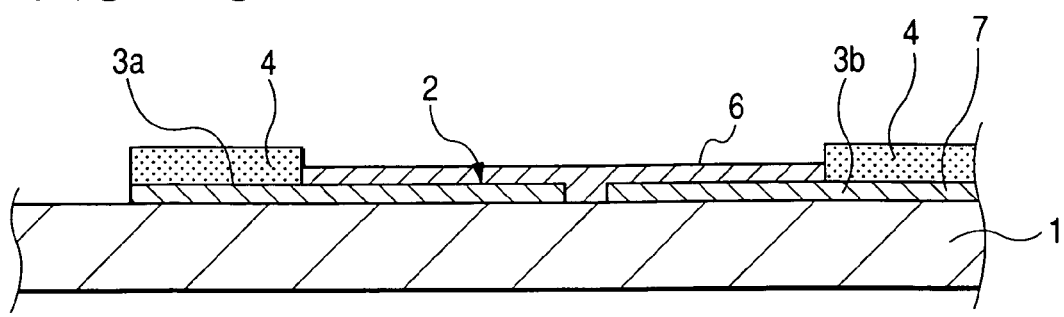
FIG. 25 is a sectional view taken along the line 25-25 in FIG. 24.
Figure 26:
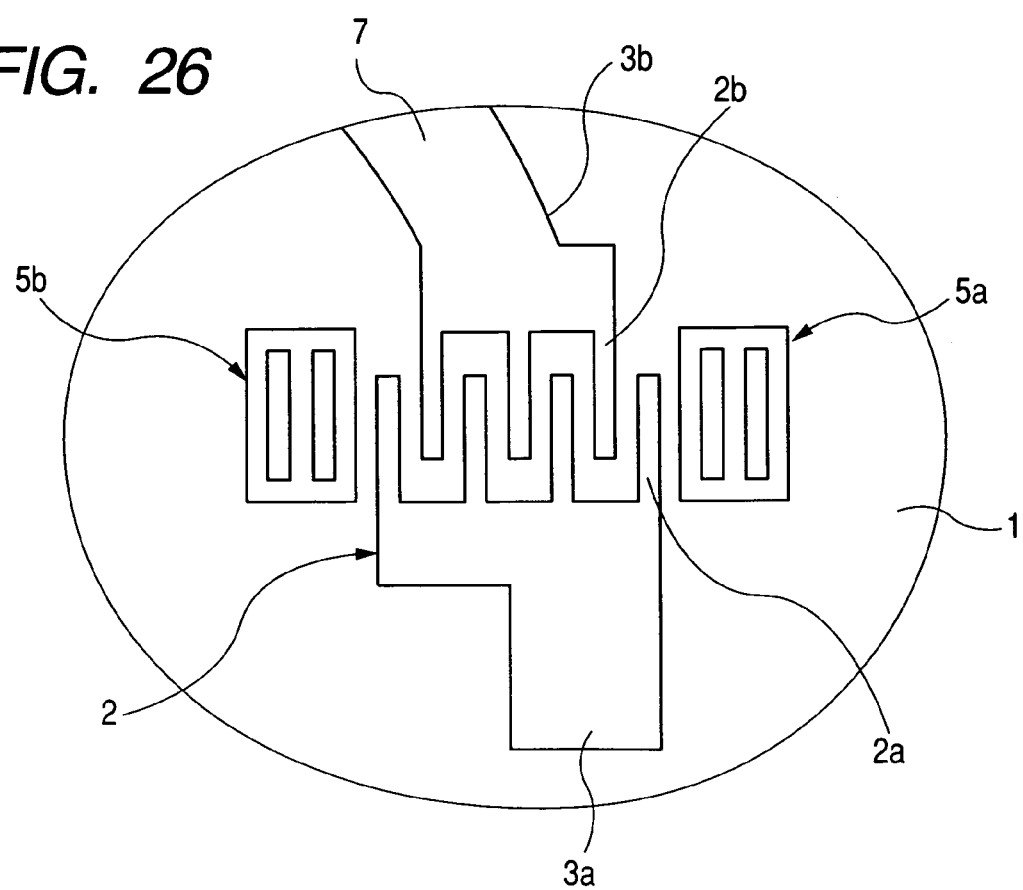
FIG. 26 is a plan view showing a comb-like electrode and a reflector of the surface acoustic wave device according to the second embodiment of the invention.
Figure 27:
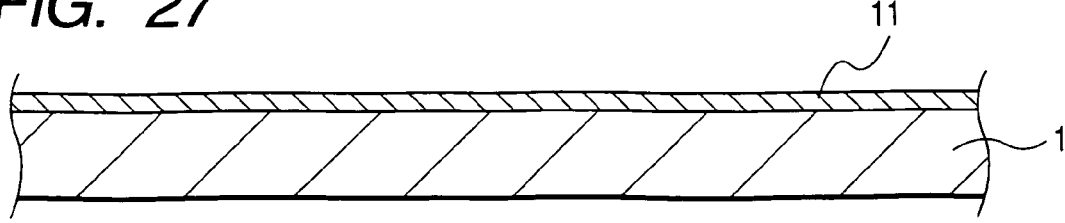
FIG. 27 is a plan view showing a first process of a method of manufacturing a surface acoustic wave device according to the second embodiment of the invention.
Figure 28:
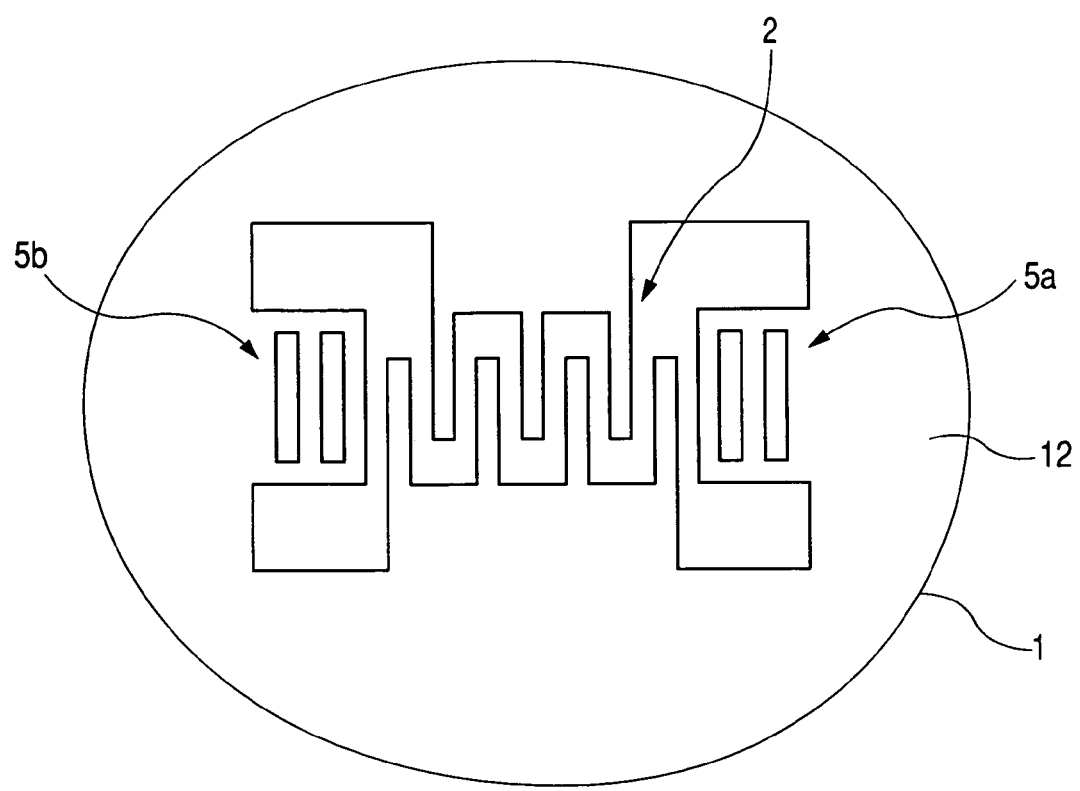
FIG. 28 is a plan view showing a second process of the method of manufacturing a surface acoustic wave device according to the second embodiment of the invention.
Figure 29:
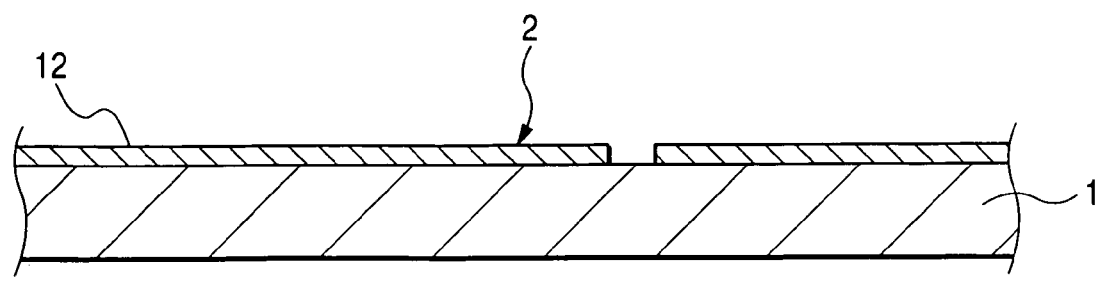
FIG. 29 is a plan view showing the second process of the method of manufacturing a surface acoustic wave device according to the second embodiment of the invention.

Further, FIG. 23 is a plan view of a surface acoustic wave device according to a second embodiment of the invention, FIG. 24 is an enlarged plan view of essential parts of the surface acoustic wave device according to a second embodiment of the invention, FIG. 25 is a sectional view taken along the line 25-25 in FIG. 24, FIG. 26 is a plan view showing a comb-like electrode and a reflector of the surface acoustic wave device according to the second embodiment of the invention, FIG. 27 is a plan view showing a first process of a method of manufacturing a surface acoustic wave device according to the second embodiment of the invention, FIG. 28 is a plan view showing a second process of the method of manufacturing a surface acoustic wave device according to the second embodiment of the invention, and FIG. 29 is a plan view showing the second process of the method of manufacturing a surface acoustic wave device according to the second embodiment of the invention.

Figure 30:
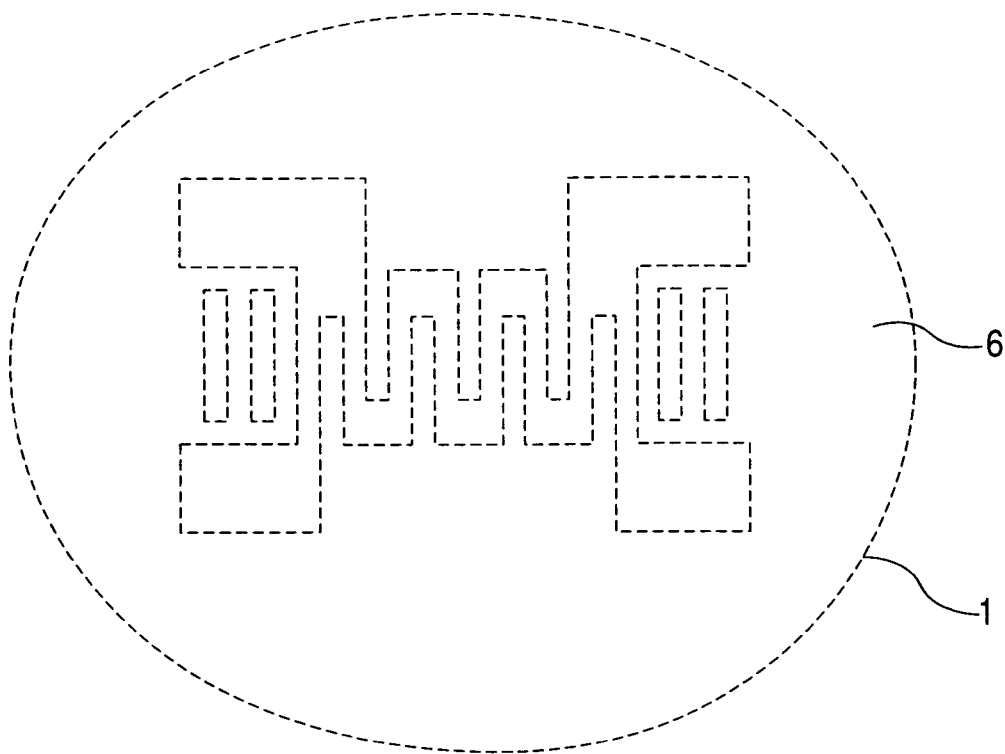
FIG. 30 is a plan view showing a third process of the method of manufacturing a surface acoustic wave device according to the second embodiment of the invention.
Figure 31:
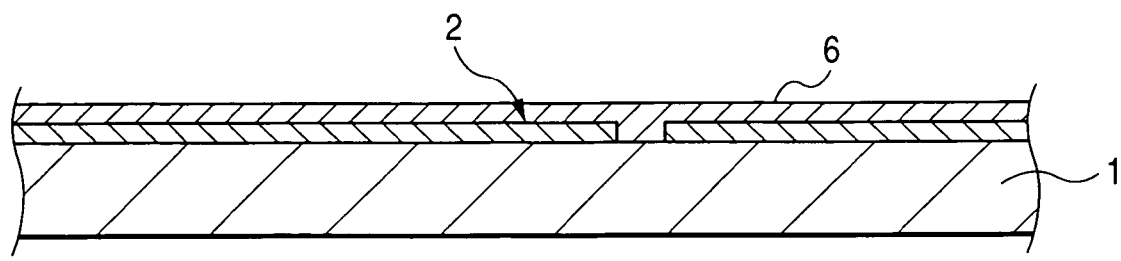
FIG. 31 is a plan view showing the third process of the method of manufacturing a surface acoustic wave device according to the second embodiment of the invention.
Figure 32:
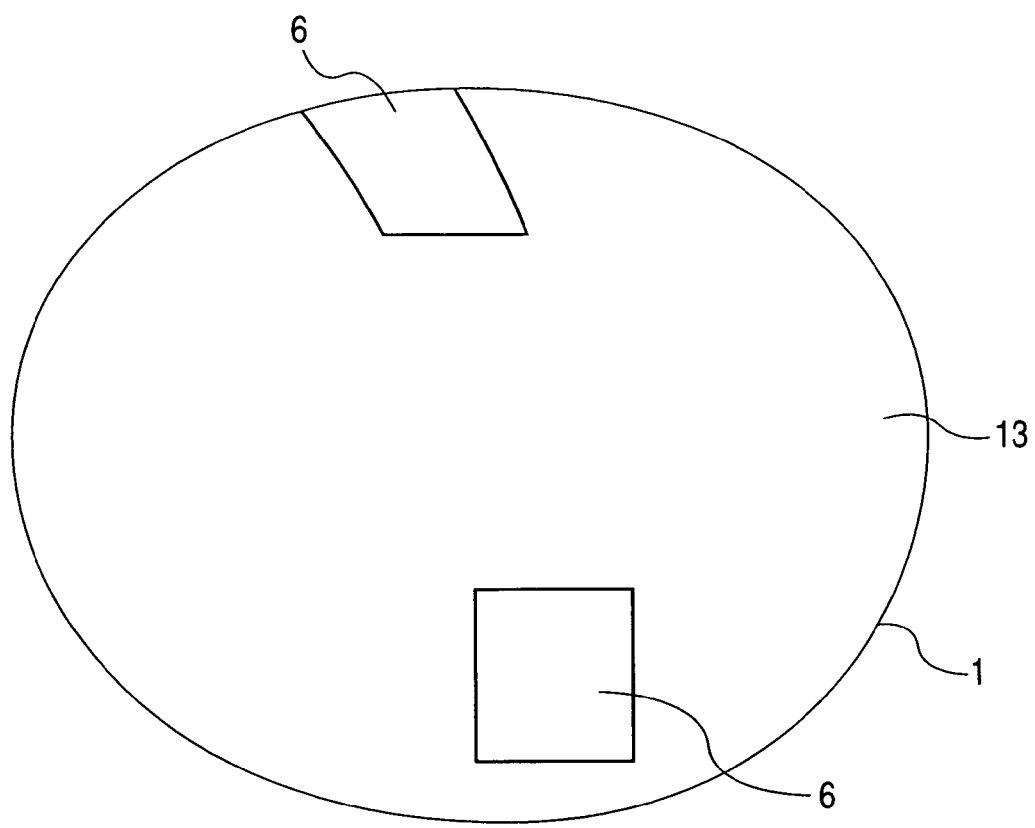
FIG. 32 is a plan view showing a fourth process of the method of manufacturing a surface acoustic wave device according to the second embodiment of the invention.
Figure 33:
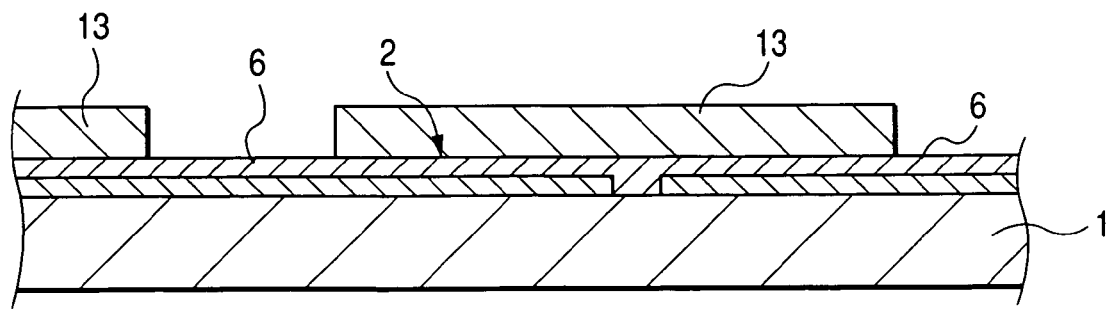
FIG. 33 is a plan view showing the fourth process of the method of manufacturing a surface acoustic wave device according to the second embodiment of the invention.
Figure 34:
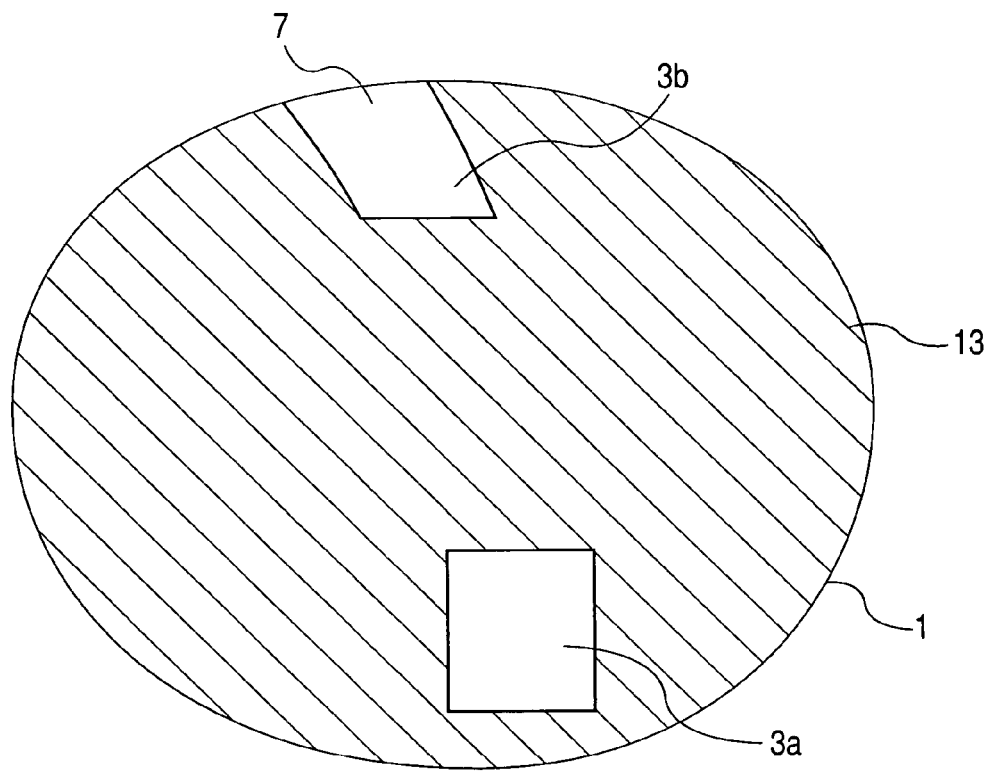
FIG. 34 is a plan view showing a fifth process of the method of manufacturing a surface acoustic wave device according to the second embodiment of the invention.
Figure 35:
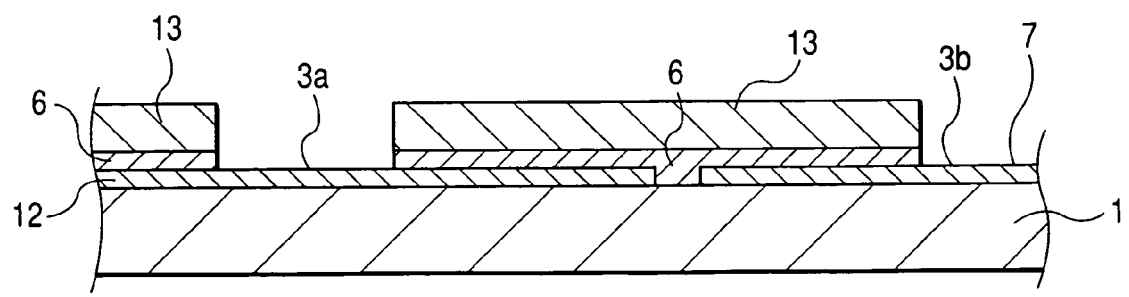
FIG. 35 is a plan view showing the fifth process of the method of manufacturing a surface acoustic wave device according to the second embodiment of the invention.

Further, FIG. 30 is a plan view showing a third process of the method of manufacturing a surface acoustic wave device according to the second embodiment of the invention, FIG. 31 is a plan view showing the third process of the method of manufacturing a surface acoustic wave device according to the second embodiment of the invention, FIG. 32 is a plan view showing a fourth process of the method of manufacturing a surface acoustic wave device according to the second embodiment of the invention, FIG. 33 is a plan view showing the fourth process of the method of manufacturing a surface acoustic wave device according to the second embodiment of the invention, FIG. 34 is a plan view showing a fifth process of the method of manufacturing a surface acoustic wave device according to the second embodiment of the invention, and FIG. 35 is a plan view showing the fifth process of the method of manufacturing a surface acoustic wave device according to the second embodiment of the invention.

Figure 36:
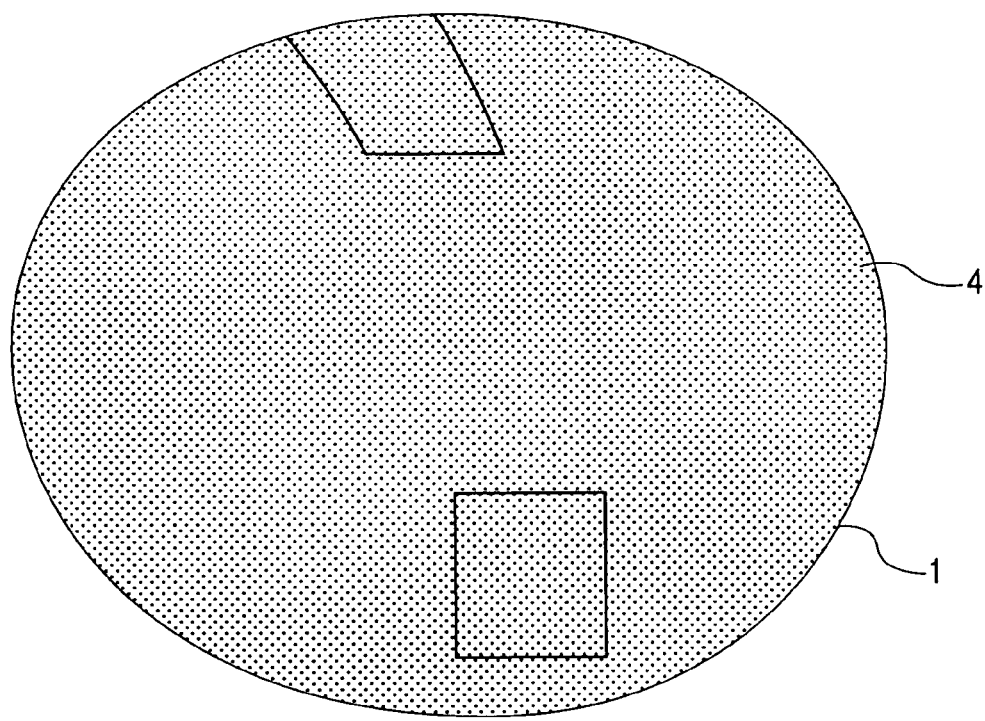
FIG. 36 is a plan view showing a sixth process of the method of manufacturing a surface acoustic wave device according to the second embodiment of the invention.
Figure 37:
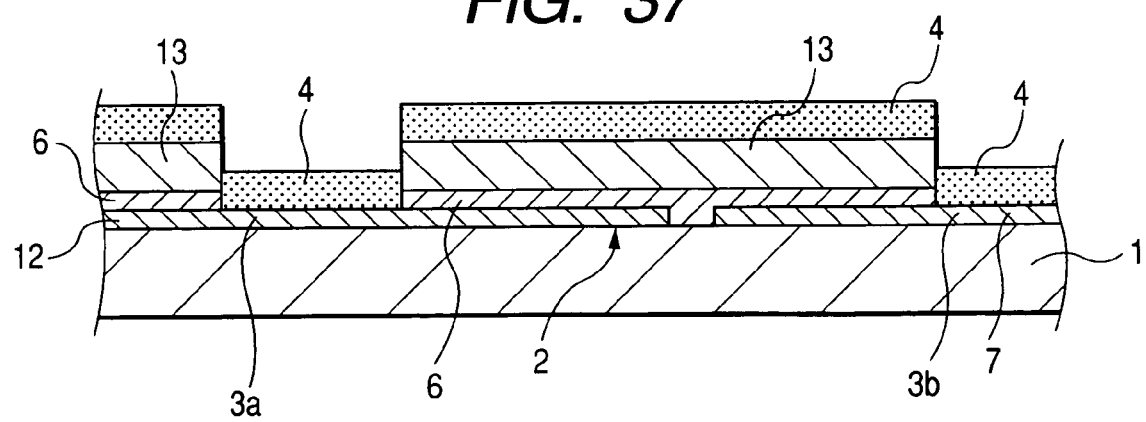
FIG. 37 is a plan view showing the sixth process of the method of manufacturing a surface acoustic wave device according to the second embodiment of the invention.
Figure 38:
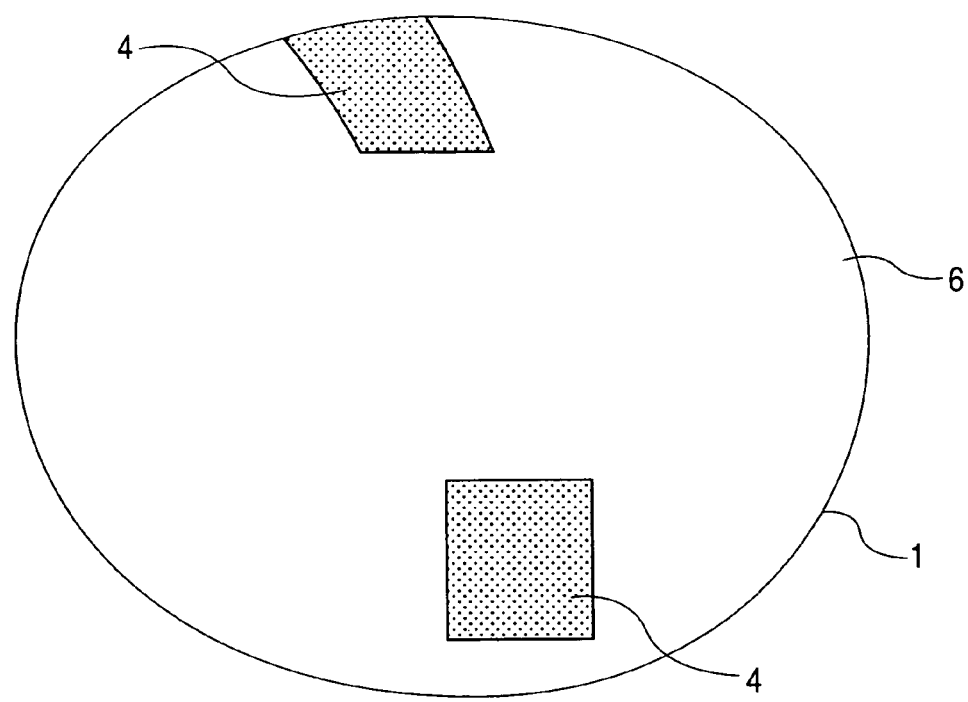
FIG. 38 is a plan view showing a seventh process of the method of manufacturing a surface acoustic wave device according to the second embodiment of the invention.
Figure 39:
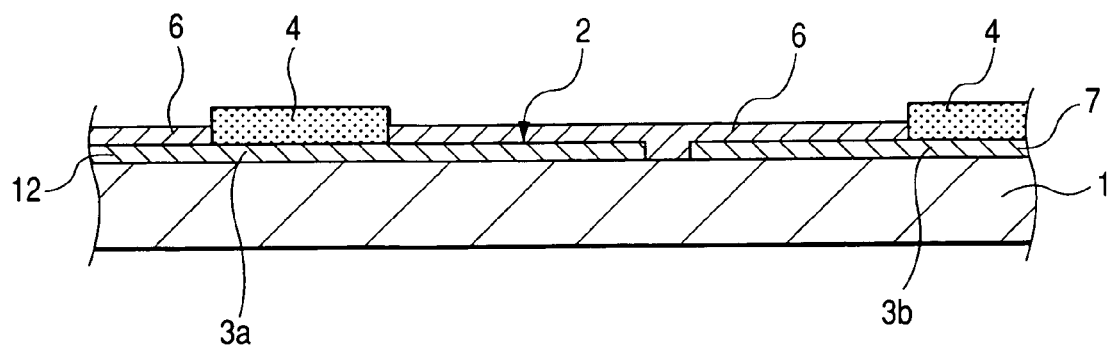
FIG. 39 is a plan view showing the seventh process of the method of manufacturing a surface acoustic wave device according to the second embodiment of the invention.
Figure 40:
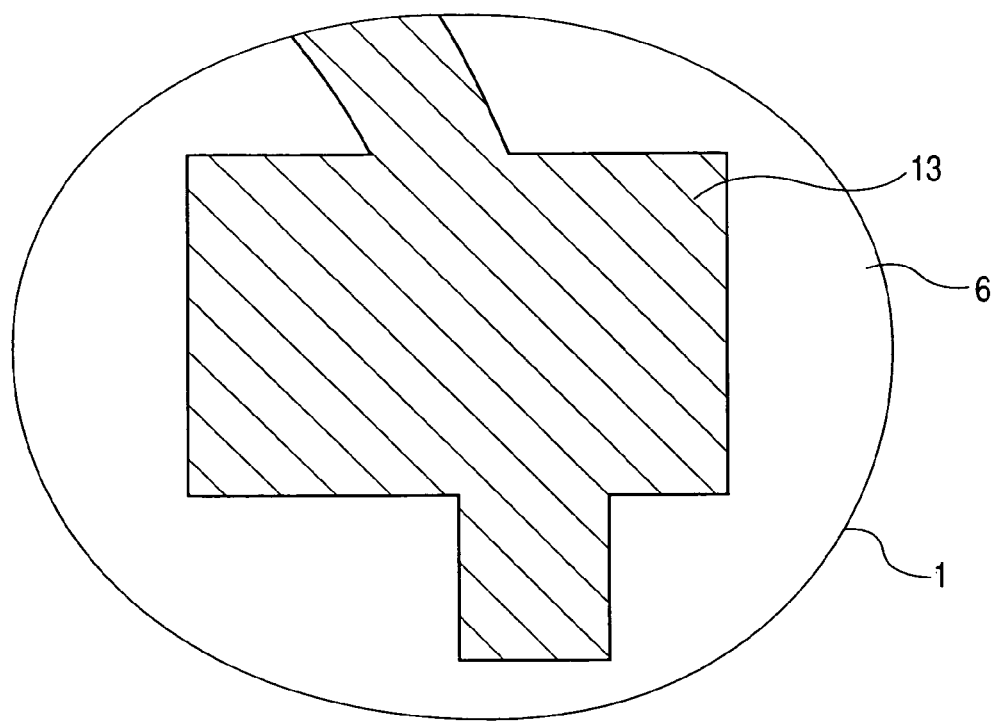
FIG. 40 is a plan view showing an eighth process of the method of manufacturing a surface acoustic wave device according to the seventh embodiment of the invention.
Figure 41:
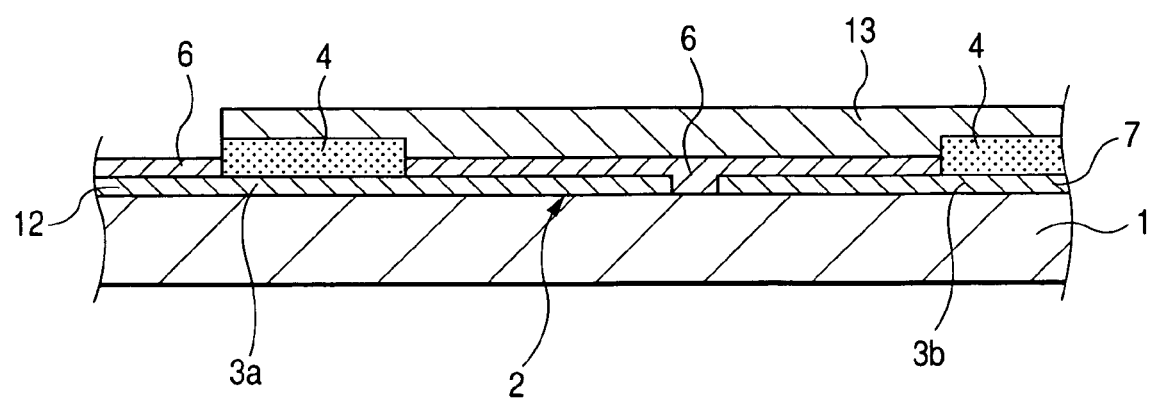
FIG. 41 is a plan view showing the eighth process of the method of manufacturing a surface acoustic wave device according to the second embodiment of the invention.
Figure 42:
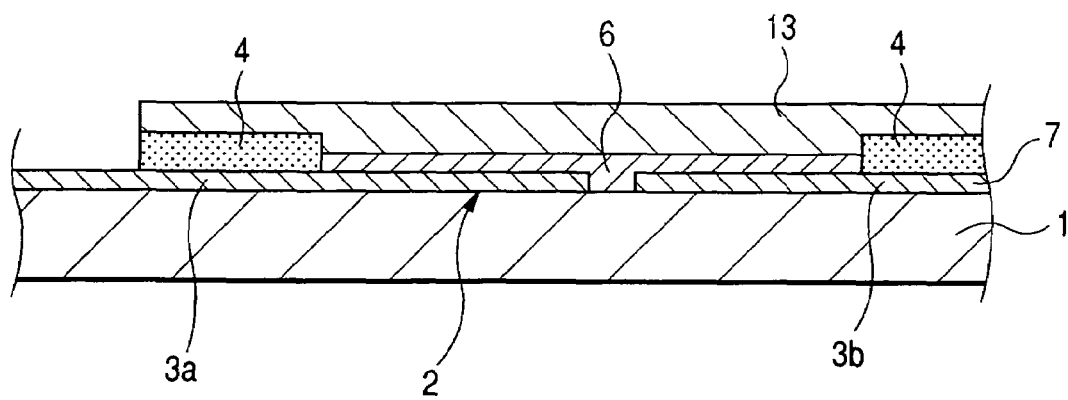
FIG. 42 is a plan view showing a ninth process of the method of manufacturing a surface acoustic wave device according to the second embodiment of the invention.
Figure 43:
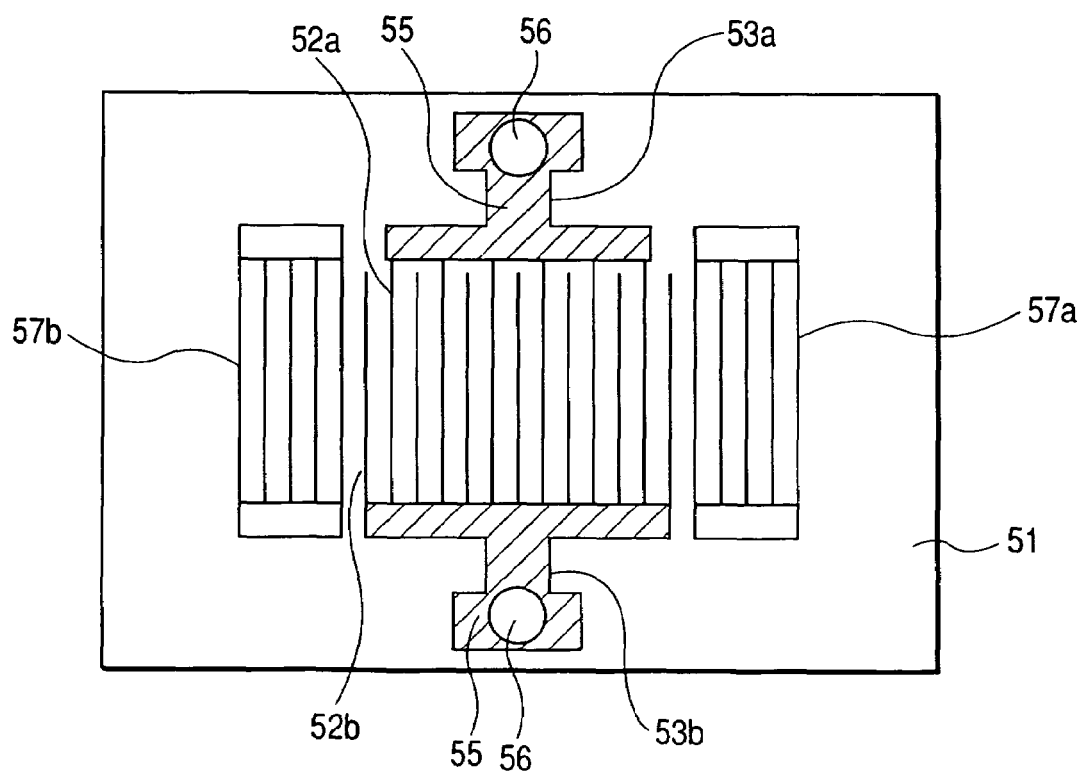
FIG. 43 is a plan view showing a comb-like electrode and a reflector of a conventional surface acoustic wave device.
Figure 44:
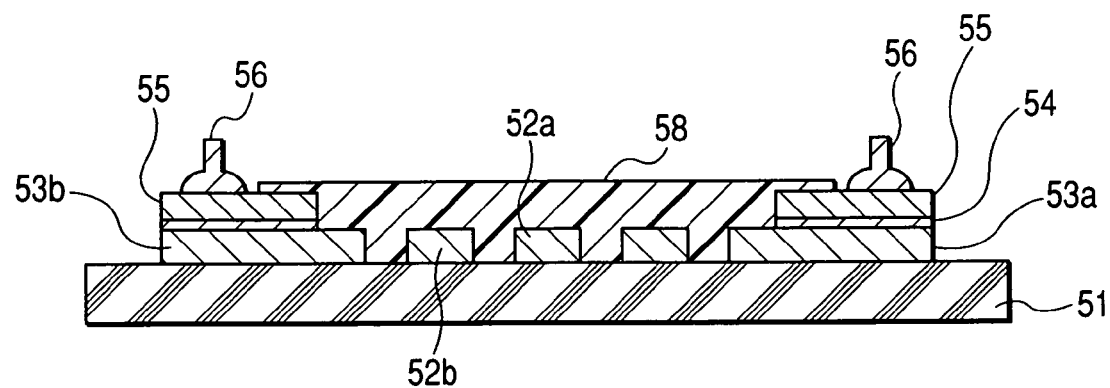
FIG. 44 is a sectional view of essential parts of the conventional surface acoustic wave device.
Figure 45:
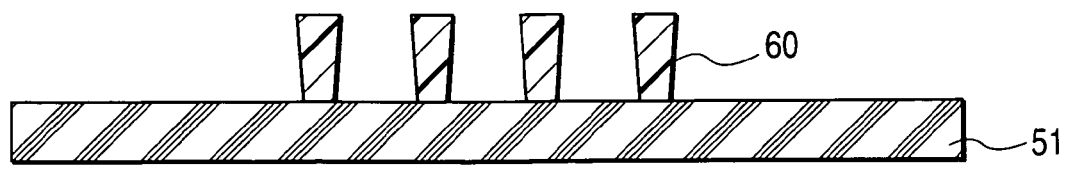
FIG. 45 is a sectional view of essential parts showing a first process of a method of manufacturing the conventional surface acoustic wave device.
Figure 46:
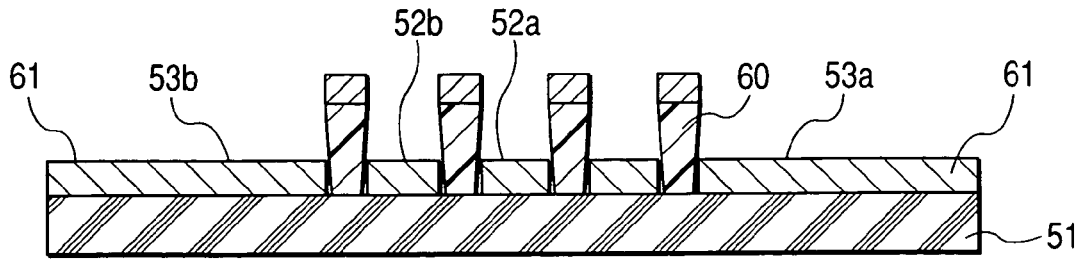
FIG. 46 is a sectional view of essential parts showing a second process of the method of manufacturing the conventional surface acoustic wave device.
Figure 47:
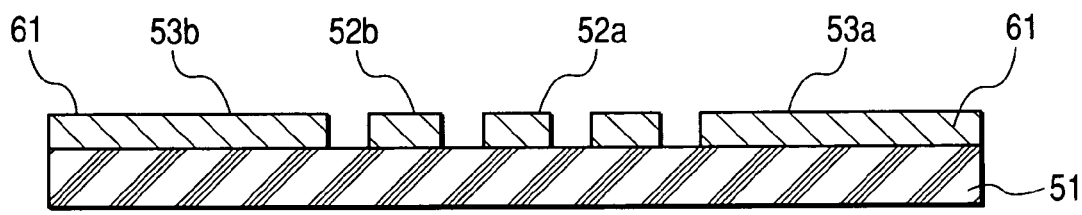
FIG. 47 is a sectional view of essential parts showing a third process of the method of manufacturing the conventional surface acoustic wave device.
Figure 48:
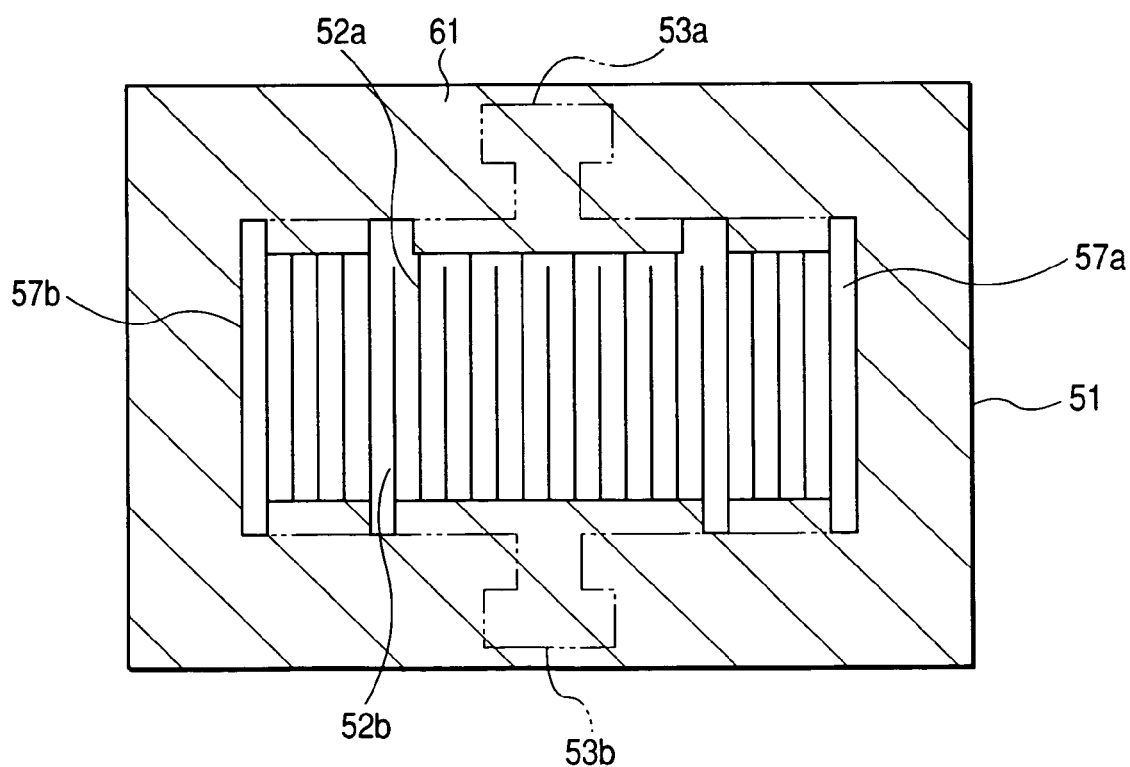
FIG. 48 is a plan view showing the third process of the method of manufacturing the conventional surface acoustic wave device.
Figure 49:
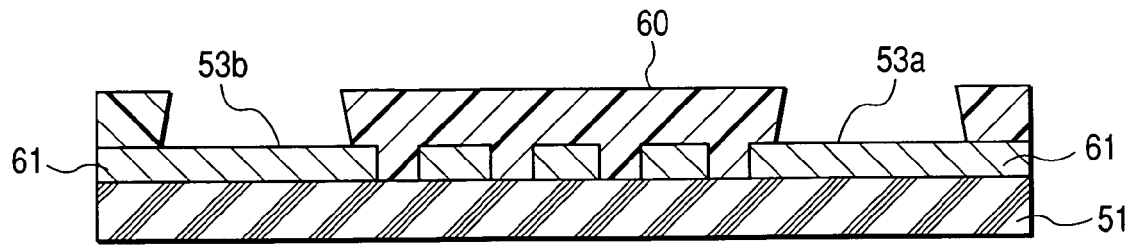
FIG. 49 is a sectional view of essential parts showing a fourth process of the method of manufacturing the conventional surface acoustic wave device.
Figure 50:
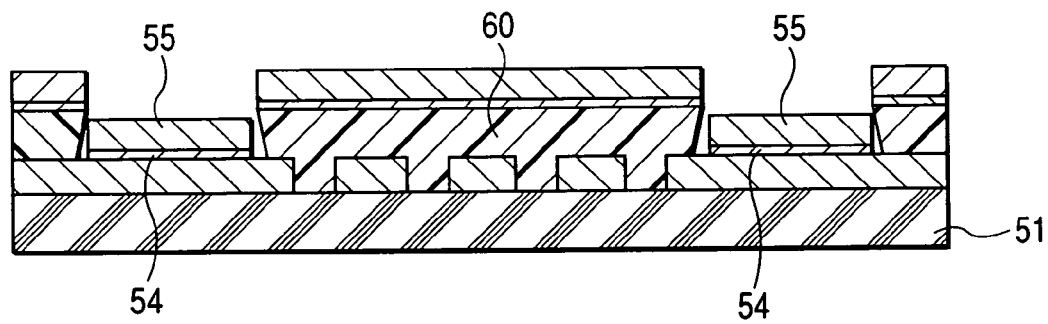
FIG. 50 is a sectional view of essential parts showing a fifth process of the method of manufacturing the conventional surface acoustic wave device.
Figure 51:
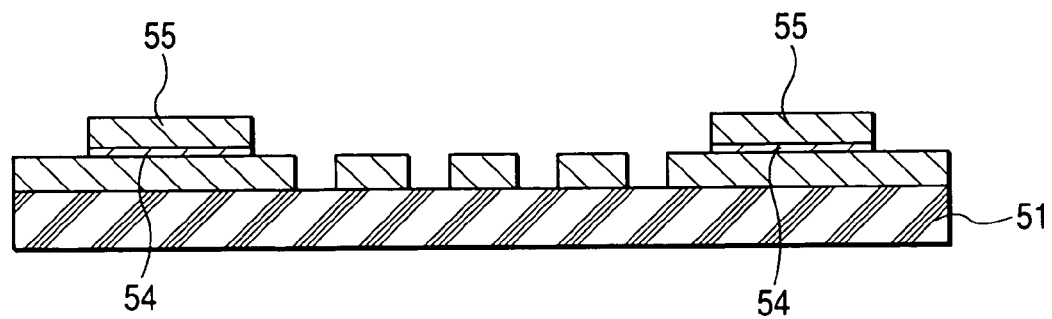
FIG. 51 is a sectional view of essential parts showing a sixth process of the method of manufacturing the conventional surface acoustic wave device.
Figure 52:
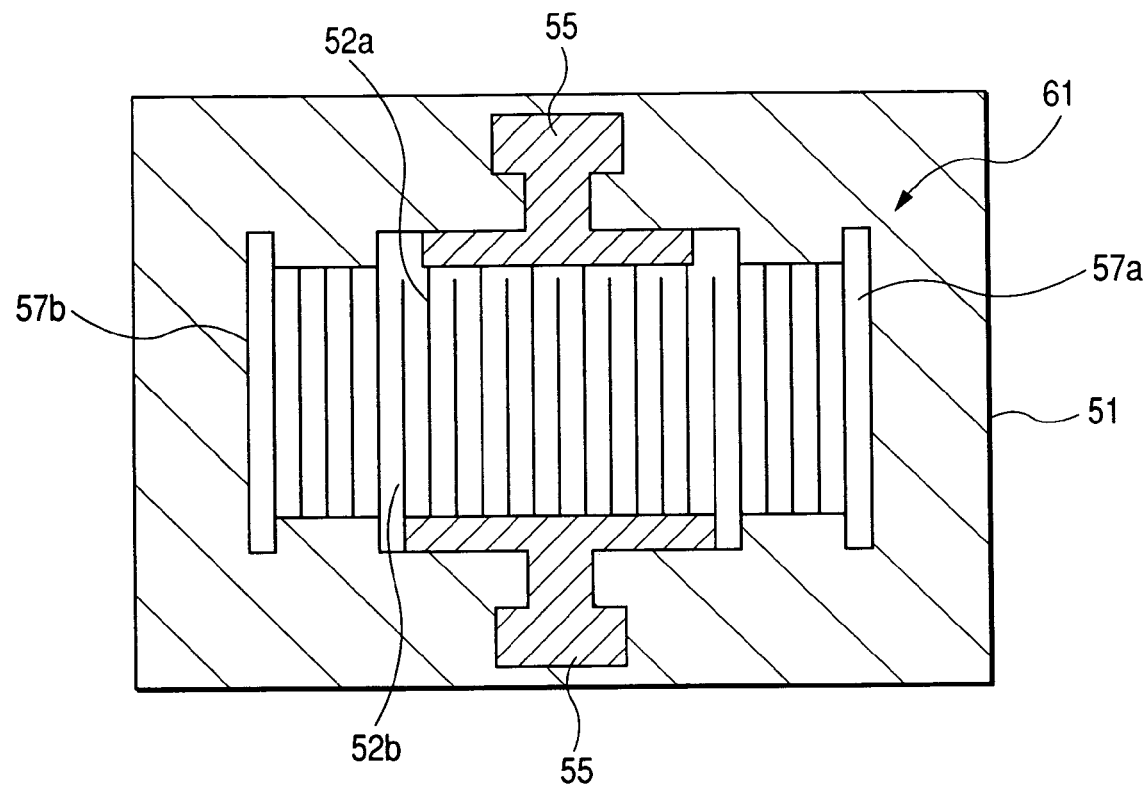
FIG. 52 is a plan view showing the sixth process of the method of manufacturing the conventional surface acoustic wave device.
Figure 53:
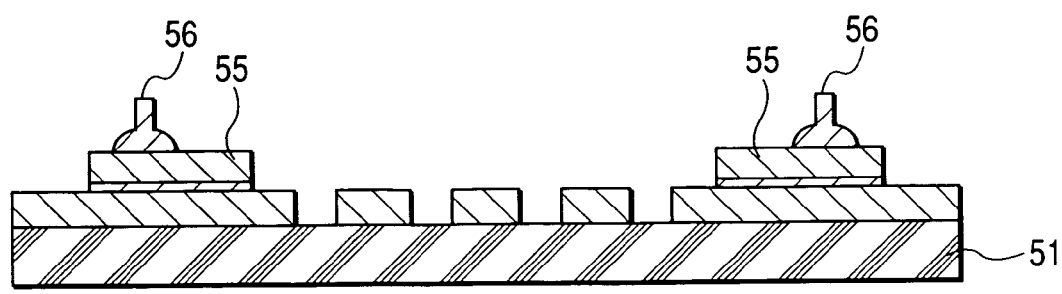
FIG. 53 is a sectional view of essential parts showing a seventh process of the method of manufacturing the conventional surface acoustic wave device.
Figure 54:
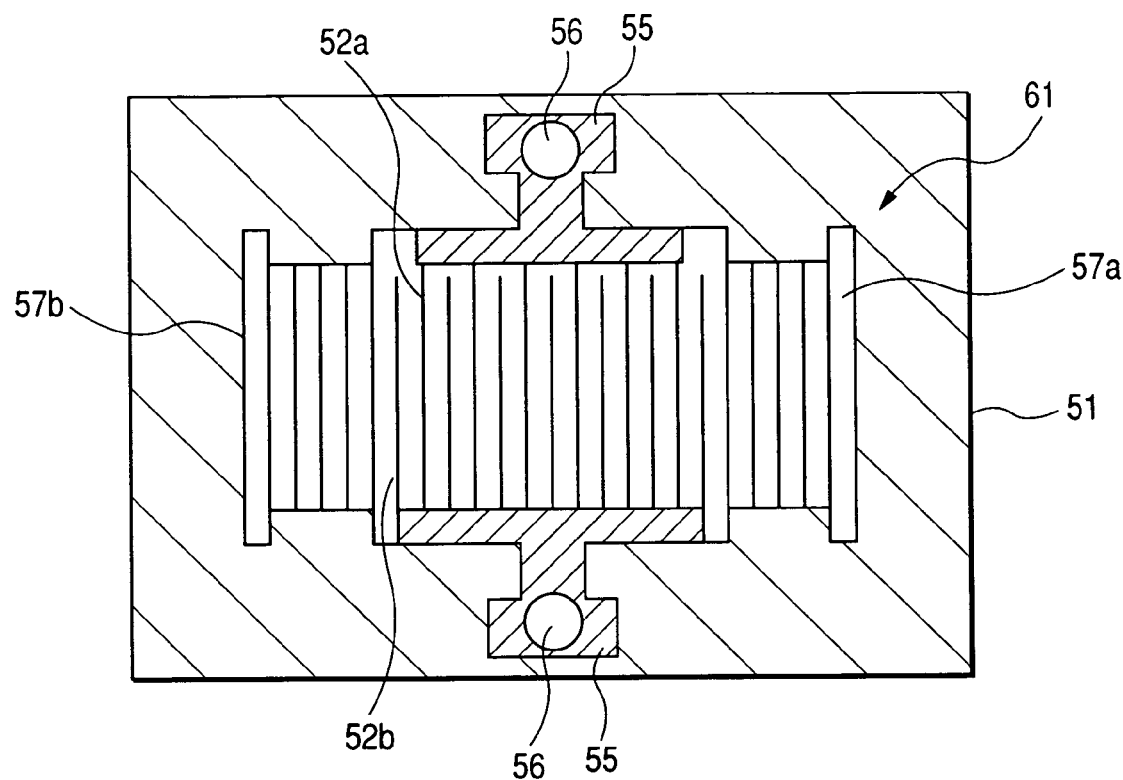
FIG. 54 is a plan view showing the seventh process of the method of manufacturing the conventional surface acoustic wave device.
Figure 55:
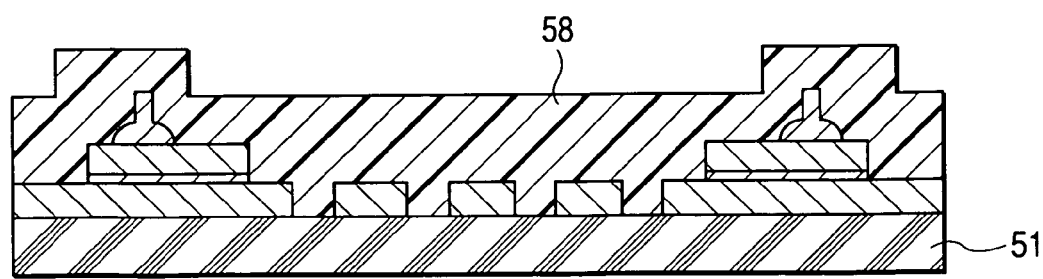
FIG. 55 is a sectional view of essential parts showing an eighth process of the method of manufacturing the conventional surface acoustic wave device.
Figure 56:
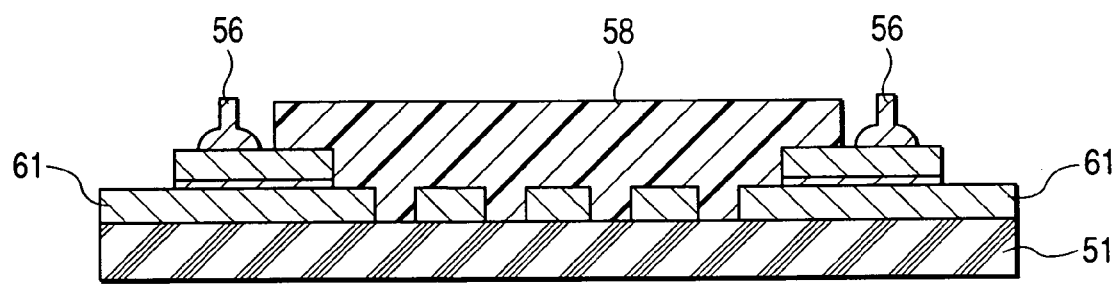
FIG. 56 is a sectional view of essential parts showing a ninth process of the method of manufacturing the conventional surface acoustic wave device.
Figure 57:
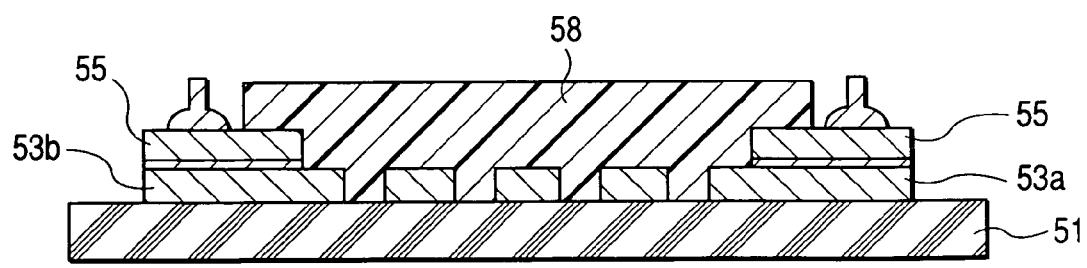
FIG. 57 is a sectional view of essential parts showing the ninth process of the method of manufacturing the conventional surface acoustic wave device.

Further, FIG. 36 is a plan view showing a sixth process of the method of manufacturing a surface acoustic wave device according to the second embodiment of the invention, FIG. 37 is a plan view showing the sixth process of the method of manufacturing a surface acoustic wave device according to the second embodiment of the invention, FIG. 38 is a plan view showing a seventh process of the method of manufacturing a surface acoustic wave device according to the second embodiment of the invention, FIG. 39 is a plan view showing the seventh process of the method of manufacturing a surface acoustic wave device according to the second embodiment of the invention, FIG. 40 is a plan view showing an eighth process of the method of manufacturing a surface acoustic wave device according to the seventh embodiment of the invention, FIG. 41 is a plan view showing the eighth process of the method of manufacturing a surface acoustic wave device according to the second embodiment of the invention, and FIG. 42 is a plan view showing a ninth process of the method of manufacturing a surface acoustic wave device according to the second embodiment of the invention.

Next, the construction of a surface acoustic wave device according to a first embodiment of the invention will be described with reference to FIGS. 1 to 4. Referring to these drawings, on one surface of a piezoelectric substrate 1 is formed a surface acoustic wave device including a paired set of two inter digital transducer 2, electrode sections 3a and 3b connected to facing digital portions 2a and 2b, respectively, of the inter digital transducer 2, a conductor layer 4 provided on the electrode sections 3a and 3b, and reflectors 5a and 5b provided adjacent to both sides of the inter digital transducer 2.

Also, the inter digital transducer 2, the electrode sections 3a and 3b, and the reflectors 5a and 5b are formed from the same metallic material, such as copper or copper alloy, and the conductive layer 4 is formed from aluminum. The conductive layer 4 is formed on the electrode sections 3a and 3b, which increases the thickness and thus decreases an electrical resistance.

Further, an insulating film 6 made of silicon oxide is provided on one surface of the piezoelectric substrate 1. This insulating film 5 is provided so as to all the regions of the inter digital transducer 2 and the reflectors 5a and 5b extending over the inter digital transducer 2 and the reflectors 5a and 5b and spots of the conductor layer 4 are used for external connection, thereby forming the surface acoustic wave device according to the invention.

Next, a method of manufacturing the surface acoustic wave device having such a construction will be described with reference to FIGS. 5 to 22. First, as shown in FIGS. 5 and 6, a conductor 11 made of copper, etc. is formed on one entire surface of a piezoelectric substrate 1. Thereafter, as shown in FIGS. 7 and 8, inter digital transducer 2 and reflectors 5a and 5b are formed by milling. At this time, the inter digital transducer 2 and the reflectors 5a and 5b are electrically connected by a protective conductor 12 to be formed from the left conductor 11.

In addition, the formation of the inter digital transducer 2, reflectors 5a and 5b, and protective conductor 12 may be performed by other electrode forming techniques or processing techniques, such as liftoff.

Next, as shown in FIGS. 9 and 10, an insulating film 6 made of silicon oxide is formed on the one entire surface of the piezoelectric substrate 1 by spin coating in a state where it covers the inter digital transducer 2, the reflectors 5a and 5b, and the protective conductor 12. Thereafter, a negative resist film 13 is formed on the insulating film 6 and exposed using a mask. Then, the exposed resist film 13, as shown in FIGS. 11 and 12, is left by removing the resist film 13, which has not been exposed, by a solution. In addition, a positive resist film may be used as the resist film 13.

At this time, since the left resist film 13 is put in a state where their portions other than the spots corresponding to the electrode sections 3a and 3b are left and during formation of the insulating film 6, the inter digital transducer 2 and the reflectors 5a and 5b are in a state where they are electrically connected to one another by the protective conductor 12, pyroelectric destruction will not occur.

Next, as shown in FIGS. 13 and 14, the insulating film 6 exposed through the resist film 13 is removed by chemical etching to expose the spots to serve as the electrode sections 3a and 3b. Thereafter, as shown in FIGS. 15 and 16, a conductor layer 4 made of aluminum is formed on the one entire surface of the piezoelectric substrate 1 by sputtering. After that, as shown in FIGS. 17 and 18, when the resist film 13 is dissolved by a solvent, the conductor layer 4 attached on the resist film 13 is removed, which results in a state where the conductor layer 4 is formed on only the electrode section 3a and 3b.

At this time, since the conductor layer 4 on the electrode sections 3a and 3b is formed by the insulating film 6, and during formation of the insulating film 4, the inter digital transducer 2 and the reflectors 5a and 5b are in a state where they are electrically connected to one another by the protective conductor 12, pyroelectric destruction will not occur.

Next, a negative resist film 13 is formed on the one entire surface of the piezoelectric substrate 1 and then exposed using a mask. Thereafter, the exposed resist film 13, as shown in FIGS. 19 and 20, is left by removing the resist film 13, which has not been exposed, by a solution. In addition, a positive resist film may be used as the resist film 13.

At this time, the resist film 13 is left on spots on the conductor layer 4 on the electrode sections 3a and 3b and on spots on the insulating film 6 located in the regions of the inter digital transducer 2 and the reflectors 5a and 5b.

Next, as shown in FIGS. 21 and 22, the insulating film 6 on the protective conductor 12 is removed by chemical etching, and the protective conductor 12 is removed by etching. Thereafter, when the resist film 13 is removed, the surface acoustic wave device as shown in FIGS. 1 to 3 is formed, and thereby the manufacture thereof is completed.

Further, FIGS. 23 to 26 show a surface acoustic wave device according to a second embodiment of the invention. Referring to the construction of the second embodiment, a plurality of paired sets of the inter digital transducer 2, the reflectors 5a and 5a in each set of the inter digital transducer 2, the insulating film 6 provided to cover the entire regions of each set of the inter digital transducer 2 and the reflectors 5a and 5b, a connection pattern 7 connected to the electrode sections 3a and 3b joined to the digital portions 2a and 2b of each set of the inter digital transducer 2 to join the inter digital transducer 3a and 3b together, and the conductor layer 4 provided on the electrode sections 3a and 3b and the connection pattern 7 are provided on the one surface of the piezoelectric substrate 1, and the electrode sections 3a and 3b and connection points P of the connection pattern 7 are used for external connection, thereby forming the surface acoustic wave device according to the invention.

Next, a method of manufacturing the surface acoustic wave device according to the invention having such a construction will be described with reference to FIGS. 27 to 42. First, as shown in FIG. 27, a conductor 11 made of copper, etc. is formed. As shown in FIGS. 28 and 29, a plurality of sets of the inter digital transducer 2 and the reflectors 5a and 5b corresponding to the plurality of sets of inter digital transducer 2 are formed by milling. At this time the inter digital transducer 2 and the reflectors 5a and 5b are in a state where they are electrically connected to one another by the protective conductor 12 to be formed by the left conductor 11.

In addition, the formation of the inter digital transducer 2, reflectors 5a and 5b, and protective conductor 12 may be performed by other electrode forming techniques or processing techniques, such as liftoff.

Next, as shown in FIGS. 30 and 31, an insulating film 6 made of silicon oxide is formed on the one entire surface of the piezoelectric substrate 1 by spin coating in a state where it covers the inter digital transducer 2, the reflectors 5a and 5b, and the protective conductor 12. Thereafter, a negative resist film 13 is formed on the insulating film 6 and exposed using a mask. Then, the exposed resist film 13, as shown in FIGS. 32 and 33, is left by removing the resist film 13, which has not been exposed, by a solution. In addition, a positive resist film may be used as the resist film 13.

At this time, since the left resist film 13 is put in a state where their portions other than the spots corresponding to the electrode sections 3a and 3b and the connection pattern 7 are left and during formation of the insulating film 6, the inter digital transducer 2 and the reflectors 5a and 5b are in a state where they are electrically connected to one another by the protective conductor 12, pyroelectric destruction will not occur.

Next, as shown in FIGS. 34 and 35, the insulating film 6 exposed through the resist film 13 is removed by chemical etching to expose the spots to serve as the electrode sections 3a and 3b and the connection pattern 7. Thereafter, as shown in FIGS. 36 and 37, a conductor layer 4 is formed on the one entire surface of the piezoelectric substrate 1 by sputtering. After that, as shown in FIGS. 38 and 39, when the resist film 13 is dissolved by a solvent, the conductor layer 4 attached on the resist film 13 is removed, which results in a state where the conductor layer 4 is formed on only the electrode section 3a and 3b and the connection pattern 7.

At this time, since the conductor layer 4 on the electrode sections 3a and 3b and the connection pattern 7 is formed by the insulating film 6, and during formation of the insulating film 4, the inter digital transducer 2 and the reflectors 5a and 5b are in a state where they are electrically connected to one another by the protective conductor 12, pyroelectric destruction will not occur.

Next, a negative resist film 13 is formed on the one entire surface of the piezoelectric substrate 1 and then exposed using a mask. Thereafter, the exposed resist film 13, as shown in FIGS. 40 and 41, is left by removing the resist film 13, which has not been exposed, by a solution. In addition, a positive resist film may be used as the resist film 13.

At this time, the resist film 13 is left on spots on the conductor layer 4 on the electrode sections 3a and 3b and connection pattern 7 and on spots on the insulating film 6 located in the regions of the inter digital transducer 2 and the reflectors 5a and 5b.

Next, as shown in FIG. 42, the insulating film 6 on the protective conductor 12 is removed by chemical etching, and the protective conductor 12 is removed by etching. Thereafter, when the resist film 13 is removed, the surface acoustic wave device as shown in FIGS. 23 to 25 is formed, and thereby the manufacture thereof is completed.

The invention claimed is:

1. A method of manufacturing a surface acoustic wave device which prevents sticking of foreign matters, the surface acoustic wave device including a piezoelectric substrate; at least one paired set of inter digital transducer provided on one surface of the piezoelectric substrate; electrode sections connected to the inter digital transducer; a conductor layer provided on the electrode sections; reflectors provided adjacent to both sides of the inter digital transducer; and an insulating film formed so as to cover entire regions of the inter digital transducer and reflectors, the method comprising steps of:

forming the inter digital transducer, the reflectors, and a protective conductor which electrically connects the inter digital transducer with the reflectors, in an entire region other than the regions where the inter digital transducer and the reflectors are formed, on the one surface of the piezoelectric substrate; forming an insulating film so as to cover at least the entire regions of the inter digital transducer and the reflectors; forming the conductor layer on the electrode sections in a state where the entire regions of the inter digital transducer and the reflectors are covered with the insulating film; and removing the protective conductor wherein the surface acoustic wave device including a plurality of sets of the inter digital transducer, the reflectors provided so as to correspond to the plurality of sets of inter digital transducer, respectively, and a connection pattern which joins the electrode sections connected to the inter digital transducer together, the method comprising the steps of:

forming the inter digital transducer, the reflectors, and the protective conductor which electrically connects the inter digital transducer with the reflectors, in an entire region other than the regions where the inter digital transducer and the reflectors are formed, on the one surface of the piezoelectric substrate; forming the insulating film so as to cover at least the entire region of each set of the inter digital transducer and the reflectors; forming the conductor layer on the electrode sections and the connection pattern in a state where the entire regions of the inter digital transducer and the reflectors are covered with the insulating film; and removing the protective conductor.

2. The method of manufacturing a surface acoustic wave device which prevents sticking of foreign matters according to claim 1, wherein the insulating film other than the regions of the inter digital transducer and the reflectors is removed and the protective conductor is removed after the insulating film is formed on the one entire surface of the piezoelectric substrate, then the insulating film is removed at locations corresponding to the electrode sections and the connection pattern, and thereafter the conductor layer is formed on the electrode sections and the connection pattern.

* * * * *